(12) United States Patent  (10) Patent No.: US 7,508,858 B2
Oktyabrsky et al.  (45) Date of Patent: Mar. 24, 2009

(54) DETUNED DUO-CAVITY LASER-MODULATOR DEVICE AND METHOD WITH DETUNING SELECTED TO MINIMIZE CHANGE IN REFLECTIVITY

(75) Inventors: Serge Oktyabrsky, Rexford, NY (US); Vadim Tokranov, Cohoes, NY (US); Michael Yakimov, Guilderland, NY (US); Jobert VanEisden, Albany, NY (US); Edris M. Mohammed, Hillsboro, OR (US); Ian Young, Portland, OR (US)

(73) Assignee: The Research Foundation of State University of New York, Albany, NY (US)

( * ) Notice: Subject to any disclaimer, the term of this patent is extended or adjusted under 35 U.S.C. 154(b) by 0 days.

(21) Appl. No.: 11/742,049

(22) Filed: Apr. 30, 2007

(65) Prior Publication Data

US 2008/0267231 A1  Oct. 30, 2008

(51) Int. Cl.
H01S 3/08 (2006.01)
(52) U.S. Cl. .................. 372/92; 372/50.11; 372/50.124
(58) Field of Classification Search ................... 372/92, 372/50.11
See application file for complete search history.

(56) References Cited

U.S. PATENT DOCUMENTS

| | | |
|---|---|---|
| 4,176,327 A | 11/1979 | Wayne et al. |
| 4,498,179 A | 2/1985 | Wayne et al. |
| RE32,812 E | 12/1988 | Zayhowski et al. |
| 4,811,352 A | 3/1989 | Suzuki et al. |
| 4,932,775 A | 6/1990 | Wissman et al. |
| 5,008,717 A | 4/1991 | Bar-Joseph et al. |
| 5,347,392 A | 9/1994 | Chen et al. |
| 5,506,170 A | 4/1996 | Yodoshi et al. |
| 5,574,738 A | 11/1996 | Morgan |
| 5,633,887 A | 5/1997 | Chung et al. |
| 6,026,108 A | 2/2000 | Lim et al. |
| 6,201,821 B1 | 3/2001 | Zhu et al. |

(Continued)

OTHER PUBLICATIONS

J. van Eisden et al., "Modulation Properties of VCSEL with Intracavity Modulator", Proceedings of the SPIE 2006 (Mar. 2007).

(Continued)

*Primary Examiner*—Dung T. Nguyen
(74) *Attorney, Agent, or Firm*—Kevin P. Radigan, Esq.; Heslin Rothenberg Farley & Mesiti, P.C.

(57) ABSTRACT

A detuned duo-cavity laser-modulator device and method are provided which include lower, middle and upper reflectors, a gain region and an absorber region integrated into a semiconductor die. The middle reflector is disposed between the lower and upper reflectors. Together, the lower and middle reflectors define a first resonant cavity, while the upper and middle reflectors define a second resonant cavity. A gain region is disposed within a laser cavity of the resonant cavities to generate an optical carrier wave, while an absorber region is disposed within a modulator cavity of the resonant cavities to modulate a signal on the optical carrier wave. The laser and modulator cavities are detuned resonant cavities, with the detuning of the laser and modulator cavities being selected to minimized change in reflection from the modulator cavity to the laser cavity when the absorber region modulates the signal on the optical carrier wave.

11 Claims, 14 Drawing Sheets

U.S. PATENT DOCUMENTS

| | | | |
|---|---|---|---|
| 6,215,805 | B1 | 4/2001 | Sartorius et al. |
| 6,295,308 | B1 | 9/2001 | Zah |
| 6,330,265 | B1 | 12/2001 | Kinoshita |
| 6,363,091 | B1 | 3/2002 | Zhu et al. |
| 6,396,083 | B1 | 5/2002 | Ortiz et al. |
| 6,434,175 | B1 | 8/2002 | Zah |
| 6,459,709 | B1 | 10/2002 | Lo et al. |
| 6,459,716 | B1 | 10/2002 | Lo et al. |
| 6,493,368 | B1 | 12/2002 | Chirovsky et al. |
| 6,574,260 | B2 | 6/2003 | Salvatore et al. |
| 6,608,846 | B1 | 8/2003 | Fischer et al. |
| 6,785,312 | B2 | 8/2004 | Sato |
| 6,897,993 | B2 | 5/2005 | Steinle |
| 7,039,078 | B2 | 5/2006 | Matsuoka et al. |
| 7,075,954 | B2 | 7/2006 | Ledentsov et al. |
| 2002/0024983 | A1 | 2/2002 | Sato |
| 2003/0099273 | A1 | 5/2003 | Murry et al. |
| 2003/0206741 | A1 | 11/2003 | Ledentsov et al. |
| 2004/0017600 | A1 | 1/2004 | Steinle |
| 2004/0160997 | A1 | 8/2004 | Peters et al. |
| 2004/0170351 | A1 | 9/2004 | Fishman et al. |
| 2004/0233944 | A1 | 11/2004 | Dantus et al. |
| 2005/0271092 | A1 | 12/2005 | Ledentsov et al. |
| 2006/0104321 | A1 | 5/2006 | He |
| 2006/0227823 | A1* | 10/2006 | Mohammed et al. .......... 372/26 |
| 2007/0291808 | A1* | 12/2007 | Ledentsov et al. ....... 372/50.11 |

OTHER PUBLICATIONS

J. van Eisden et al., "High Frequency Q-Switched Operation of a VCSEL with Intracavity Electroabsorption Modulator", Optical Society of America (2006).

* cited by examiner

DETUNED DUO-CAVITY LASER-MODULATOR DEVICE AND METHOD WITH DETUNING SELECTED TO MINIMIZE CHANGE IN REFLECTIVITY

CROSS-REFERENCE TO RELATED APPLICATION

This application contains subject matter which is related to the subject matter of the following application, which is hereby incorporated herein by reference in its entirety: "Electroabsorption Vertical Cavity Surface Emitting Laser Modulator and/or Detector", Mohammed et al., U.S. Ser. No. 11/094,873, filed Mar. 30, 2005, and published on Oct. 12, 2006 as U.S. Patent Application Publication No. 2006/0227823 A1.

TECHNICAL FIELD

This disclosure relates generally to electro-optic devices, and more particularly but not exclusively, relates to a monolithically integrated surface emitting laser with dual resonant cavities detuned to minimize change in reflectivity from one resonant cavity to the other when employed to modulate a signal on the optical carrier wave.

BACKGROUND OF THE INVENTION

Semiconductor lasers have a variety of applications including communication systems and consumer electronics. Generally, semiconductor lasers may be categorized as edge-emitting lasers or surface emitting lasers (SELs). An edge-emitting laser emits radiation parallel to a surface of the semiconductor wafer or die, while a SEL emits radiation substantially perpendicular to the surface. One common type of SEL is a vertical cavity SEL (VCSEL). A VCSEL includes a gain region within a resonant cavity with reflectors parallel to a substrate surface and having a surface aperture to emit light from the resonant cavity.

There are two main techniques for modulating a signal onto an optical carrier wave emitted from a semiconductor laser—direct modulation and external optical modulation. Direct modulation encodes the optical carrier wave with a signal by directly modulating the drive current applied to the gain region of the semiconductor laser. The bandwidths achieved by direct modulation are limited due to the finite relaxation oscillation time of an excited state electron within the gain region. This finite relaxation oscillation time can result in inter-symbol interference (ISI) between adjacent clock cycles. With external optical modulation, the semiconductor laser emits a continuous wave (CW) carrier, which is modulated by an external optical modulator (EOM). EOMs are typically distinct entities from the CW carrier source and therefore more expensive to manufacture than directly modulated lasers, but are capable of achieving higher modulation bandwidths.

Generally, EOMs may be categorized as electro-refraction modulators and electro-absorption modulators. Electro-refraction modulators rely on changes in the index of refraction of a material induced by an applied electric field to modulate the proportion of light through the modulator (for example, Mach-Zehnder interferometer). Electro-absorption modulators achieve the desired light modulation by modifying the light absorbing properties of a material with an electric field.

Notwithstanding the technique employed for modulating a signal, modulator feedback can negatively effect operation of the semiconductor laser. For example, high modulation frequency, vertical cavity surface-emitting lasers (VCSELs) and dense VCSEL arrays are expected to change the paradigm for short-range interconnections, silicon integrated circuit inputs/outputs (and perhaps long interchip) to module and board-level connections. The bandwidth of current-modulated laser diodes is limited to about 20 Gb/s by intrinsic dynamic processes in the gain medium, such as optoelectronic relaxation phenomenon and carrier transport. The bandwidth can be significantly increased by external modulation as in telecommunications applications. To prevent a high-frequency optical feedback from the modulator to the laser, resulting in parasitic amplitude modulation, frequency shift, unstable operation, excessive noise, all limiting the modulation bandwidth, an optical isolator is typically inserted between the laser and the modulator sections.

SUMMARY OF THE INVENTION

An optical isolator is conventionally based on magneto-optical Faraday's effect, and is fabricated using materials and technologies incompatible with semiconductor-based laser and electro-absorption modulator technologies, thus making the integration and miniaturization of such an optical transmitter difficult and expensive. Bulky optical isolators are incompatible and of questionable value when miniature VCSELs or VCSEL arrays are used as optical sources.

The above-noted shortcomings are overcome and additional advantages are provided through the provision in one embodiment of a semiconductor die, which includes a lower reflector, an upper reflector and a middle reflector disposed between the upper and lower reflectors. The lower and middle reflectors define a first resonant cavity within the semiconductor die, and the upper and middle reflectors define a second resonant cavity within the die optically coupled with the first resonant cavity. A gain region is disposed within one of the first resonant cavity and the second resonant cavity to generate an optical carrier wave, wherein the one of the first resonant cavity and the second resonant cavity functions as a laser cavity. An absorber region is disposed within the other of the first resonant cavity and the second resonant cavity. The absorber region modulates a signal on the optical carrier wave when subjected to a signal voltage. This other of the first resonant cavity and the second resonant cavity thus functions as a modulator cavity. The laser cavity and the modulator cavity are detuned resonant cavities, wherein detuning of the modulator and laser cavities is selected to minimize change in reflection from the modulator cavity to the laser cavity when the absorber region modulates the signal on the optical carrier wave.

In another aspect, a semiconductor die is provided which includes a first reflector, a second reflector and a middle reflector disposed between the first and second reflectors. The first and middle reflectors define a first resonant cavity within the semiconductor die and the second and middle reflectors define a second resonant cavity within the die optically coupled to the first resonant cavity. A gain region is disposed within the first resonant cavity to generate an optical carrier wave, wherein the first resonant cavity functions as a laser cavity. An absorber region is disposed within the second resonant cavity. The absorber region is provided to modulate a signal on the optical carrier wave when subjected to a signal voltage. This second resonant cavity having the absorber region functions as a modulator cavity. The laser cavity and the modulator cavity are detuned resonant cavities, and detuning of the laser cavity and the modulator cavity is selected to minimize change in reflection from the modulator cavity to the laser cavity when the absorption region modulates a signal on the optical carrier wave.

In a further aspect, a method is provided which includes: forward-biasing a first resonant cavity including a gain region disposed within a first resonant cavity to generate a carrier wave; reverse-biasing a second resonant cavity including an absorber region disposed within the second resonant cavity, the second resonant cavity optically coupled with the first resonant cavity to receive at least a first portion of the carrier wave; and modulating a voltage indicative of a signal across the absorber region to modulate the signal on the first portion of the carrier wave while minimizing change in reflectivity from the second resonant cavity to the first resonant cavity.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description of certain non-limiting and non-exhaustive embodiments of the invention described with reference to the accompanying drawings in which:

BEST MODE FOR CARRYING OUT THE INVENTION

Figure 1:
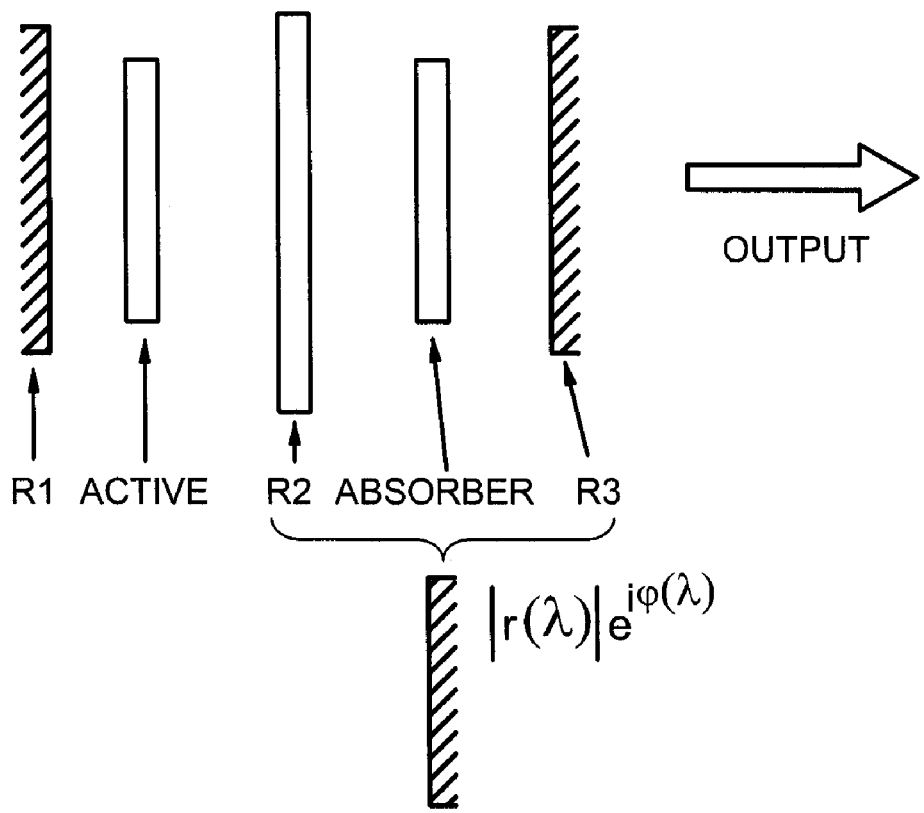
FIG. 1 is a high level representation of a detuned duo-cavity laser-modulator device, in accordance with an aspect of the present invention.

Integrated circuits will experience dramatic changes in the next decade as chips reach the 32 and 22 nm technology nodes. The most critical changes are expected to be in interconnect technology, such as clock distribution, off-chip input/output (I/O) and long on-chip data links. In fact, the goal of a high-performance integrated circuit (IC) with 3000 I/O channels and a total throughput of 10 Tb/s (32 nm technology node) will be hard to achieve using conventional electrical wire interconnect longer than a few centimeters. Optoelectronic links have been proposed as a capacitance-free alternative to metal wire interconnect. These links are estimated to be faster and more power efficient than loaded metal transmission lines over distances exceeding a few centimeters. Thus, off-chip I/O optical interconnects could be used to improve performance parameters of long interconnects, such as speed, power, fan-out and density.

An optical interconnect architecture relies on three basic components: a light emitter (or modulator with an external light source); an optical interconnect medium; and a photodetector. Current candidates for cross-chip optical interconnect systems are III-V based components grown homoepitaxially on the native substrate, and then bonded to the Si electronics in the form of individual devices or optical physical layers. GaAs (and related compounds) is the first candidate due to its mature technology and the best performance characteristics of the most compact light sources, vertical cavity surface emitting lasers (VCSEL), and p-i-n or MSM photodetectors. Certain requirements of VCSEL arrays to be used in off-chip I/O massively parallel optical interconnects include high speed, high efficiency and high density. Table 1 sets forth target specifications for a VCSEL light source for a chip-level input/output implementation. The specific environment for devices integrated with VLSI circuits creates another set of challenges such as high-temperature operation, thermal stability and low operating voltage.

TABLE 1

| Parameter | Specs |
| --- | --- |
| Modulation Frequency | 20-40 Gb/s |
| Pitch Size | <100 μm |
| Operating Temperature | >105° C. |
| Operating Voltage (swing) | <1 V |
| Power consumption/channel | ~10 mW |
| ON/OFF contrast | 6-10 db |
| Lifetime | >$10^5$ hours |

Optical modulation schemes for high bandwidth data communication applications usually include a laser source with an external modulator, because direct laser modulation is limited by internal processes in semiconductor laser diodes, such as optoelectronic relaxation oscillations or carrier transport time in the laser diode. To prevent high-frequency optical feedback from the modulator to the laser, an optical isolator is typically inserted between the laser and the modulator. The effects of optical feedback are well known and include amplitude fluctuation, frequency shift, unstable operation, and excess noise, all of which limit the modulation bandwidth. As noted initially, an optical isolator is usually based on magneto-optical Faraday's effect and is fabricated using materials and technologies incompatible with semiconductor-based laser and electro-absorption modulator technologies, thus making the integration and miniaturization of such optical transmitters difficult and expensive. In fact, bulky optical isolators are incompatible and of minimum value with miniature VCSELs or VCSEL arrays used as the optical source.

Presented herein is a novel approach to optically decouple the gain and absorber sections of a duo-cavity laser-modulator optical emitter, such as a monolithic VCSEL-modulator emitter (referred to herein as an optically detuned VCSEL-modulator (ODVM)). An ODVM device capable of functioning as an ultra-high speed (>40 Gb/s) miniature semiconductor optical source is achieved herein by controlling reflectivity from the modulator section to the gain section. As explained further below, this control of reflectivity eliminates the need for an optical isolator between the laser and the modulator. Reflectivity is controlled by selectively detuning the duo-cavity laser-modulator device to minimize change in reflectivity from the modulator cavity to the laser cavity when the absorber region modulates a signal on the optical carrier wave. The selected detuning of the ODVM device is such as to suppress the AC portion of the optical wave reflected from the modulator section using the property of a detuned Fabry-Perot cavity with absorber. A Quantum Confined Stark Effect (QCSE) modulator placed in the cavity operates as a semi-transparent VCSEL reflector with electrically modulated transmission, but with substantially constant reflectivity.

Advantageously, an ODVM device such as presented herein functions with increased bandwidth (e.g., 40-100 GH/z, or greater), with bandwidth being limited only by parasitics of a low-power reverse-biased modulator p-i-n diode; provides reduced frequency chirping, which can be controlled from negative to positive (and potentially zero) by adjustment of various phase-modulation mechanisms; has high-modulation contrast (similar to that of gain-modulated lasers) controlled by the Q-factor of the modulator cavity; provides a thermal match between the VCSEL and modulator micro-cavities due to low thermal impedance of the monolithic semiconductor structure, allowing for use without thermal stabilization and at higher temperatures; and allows growth of the VCSEL and modulator structures within a single epitaxial run, thereby increasing accuracy, reproducibility, yield, and reducing costs. Implementations of an ODVM device, and more generally of a laser-modulator method in accordance with an aspect of the present invention, are described further below with reference to FIGS. 1-16.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular aspects, features, structures, or characteristics may be combined in any suitable manner in one or more embodiments.

FIG. 1 is a high level representation of a dual-cavity laser-modulator device, in accordance with an aspect of the present invention. Generally stated, the device, which is formed in a semiconductor die, includes a first reflector R1, a second reflector R2 and a third reflector R3, with the second reflector R2 being disposed between the first reflector R1 and the third reflector R3. Together, the first reflector and second reflector define a first resonant cavity within the semiconductor die and the second and third reflector define a second resonant cavity within the die optically coupled to the first resonant cavity. A gain region is disposed within the first resonant cavity to generate an optical carrier wave, wherein the first resonant cavity functions as a laser cavity, and an absorber region is disposed within the second resonant cavity to modulate a signal on the optical carrier wave when subjected to a signal voltage, wherein the second resonant cavity functions as a modulator cavity. More particularly, the modulator cavity comprising the absorber/modulator formed by reflectors R2 and R3 functions as an output (semi-transparent) laser reflector. This modulator cavity is a Fabry-Perot cavity, and wavelength of the laser is determined by the active (gain) medium in the laser cavity formed by R1 and the modulator cavity R2-R3. In accordance with an aspect of the present invention, the laser cavity and the modulator cavity are detuned resonant cavities, wherein detuning of the laser cavity and modulator cavity is selected to minimize change in reflection from the modulator cavity to the laser cavity when the absorber region modulates a signal on the optical carrier wave.

In one embodiment, the dual-cavity device is an integrated VCSEL-modulator optical source (referred to herein as an optically detuned VCSEL-modulator (ODVM)), with the VCSEL section operating in a CW mode, and modulation achieved by applying an appropriate electrical signal to the modulator section. Significant to minimizing change in reflection from the modulator cavity to the laser cavity is suppressing the AC portion of the optical wave reflected from the modulator cavity to the laser cavity. In other words, the modulator operates as a seim-transparent VCSEL reflector with electrically modulated transmission, but with a substantially constant reflectivity. Therefore, the reflected wave does not contain the modulated RF component, and the gain, carrier concentration in the gain region, and photon density in the gain section all appear substantially constant. The change of the phase of reflection from the modulator cavity and, therefore, emission wavelength (no chirp) can be held substantially constant by design of the modulator cavity and by using counteracting index modulation mechanisms. In this case, the modulation bandwidth is determined by the electro-absorption modulator which is essentially a low-power reverse-biased photodiode with cut-off frequency determined by drift time-of-flight of carriers and parasitics. The modulation bandwidth, therefore, can be envisioned as 40-100 Gb/s, or above.

Figure 2:
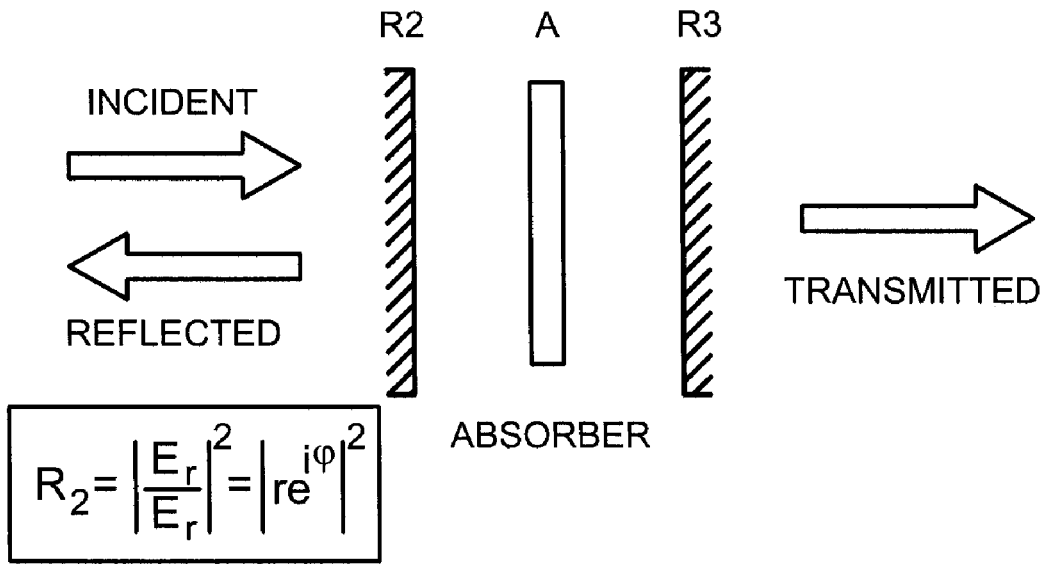
FIG. 2 is a representation of signals associated with a Fabry-Perot cavity employing an absorber modulator, for example, as the modulator cavity of a vertical cavity surface emitting laser (VCSEL), in accordance with an aspect of the present invention.
Figure 3:
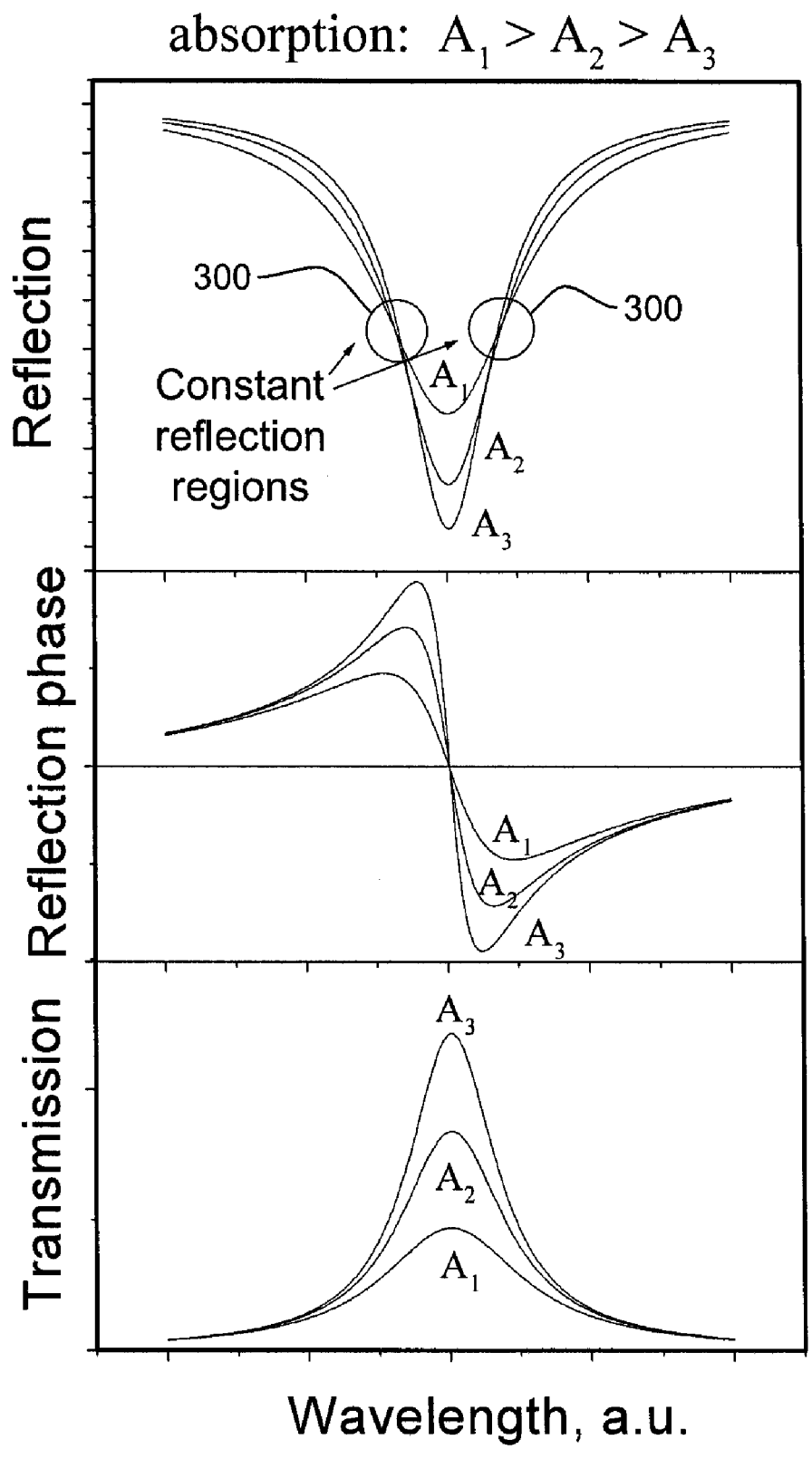
FIG. 3 is a graphical representation of wavelength change for a reflection signal, a phase of the amplitude reflection, and a transmission signal employing a Fabry-Perot cavity with different absorption coefficients (i.e., losses) and identifying two constant reflection points, in accordance with an aspect of the present invention.

The detuning approach presented herein is based on a property of a Fabry-Perot cavity, which as noted, may be employed (in one embodiment) as a VSCEL top reflector as shown in FIGS. 1 & 2, wherein the absorber region is disposed between reflectors R2 and R3. As illustrated in FIG. 3, variation of the cavity loss (or absorption coefficient $A_1, A_2, A_3$) resonance in the Fabry-Perot cavity results in a change in the width and depth of the reflection resonance dip. Note that at the constant reflection regions 300, the amplitude of the reflection is substantially constant while the absorption is modulated, and at the same wavelength, the transmission changes with modulation of the absorption. Thus, a constant reflectance of the wave from a cavity of a particular frequency is achieved within these regions or points, while cavity loss changes, and therefore, transmission of the cavity varies. As explained further herein, to realize this technique, the laser wavelength should be adequately detuned from the resonant wavelength of the modulator cavity. Additionally, modulation of the absorber is described herein to result in a very small phase shift of the reflected wave, and therefore, negligible wavelength shift of the VCSEL cavity resonance and frequency chirping.

Embodiments of an optically decoupled vertical cavity surface emitting laser modulator (ODVM) and/or detector including dual resonant cavities are described herein as one implementation of the concepts presented. The ODVM is merely one example of a detuned duo-cavity laser-modulator device and method implemented in accordance with the concepts presented herein. Other implementations are also possible. For example, the detuned duo-cavity laser-modulator device could alternatively be implemented in a semiconductor die as an in-plane waveguide cavity structure.

Figure 4:
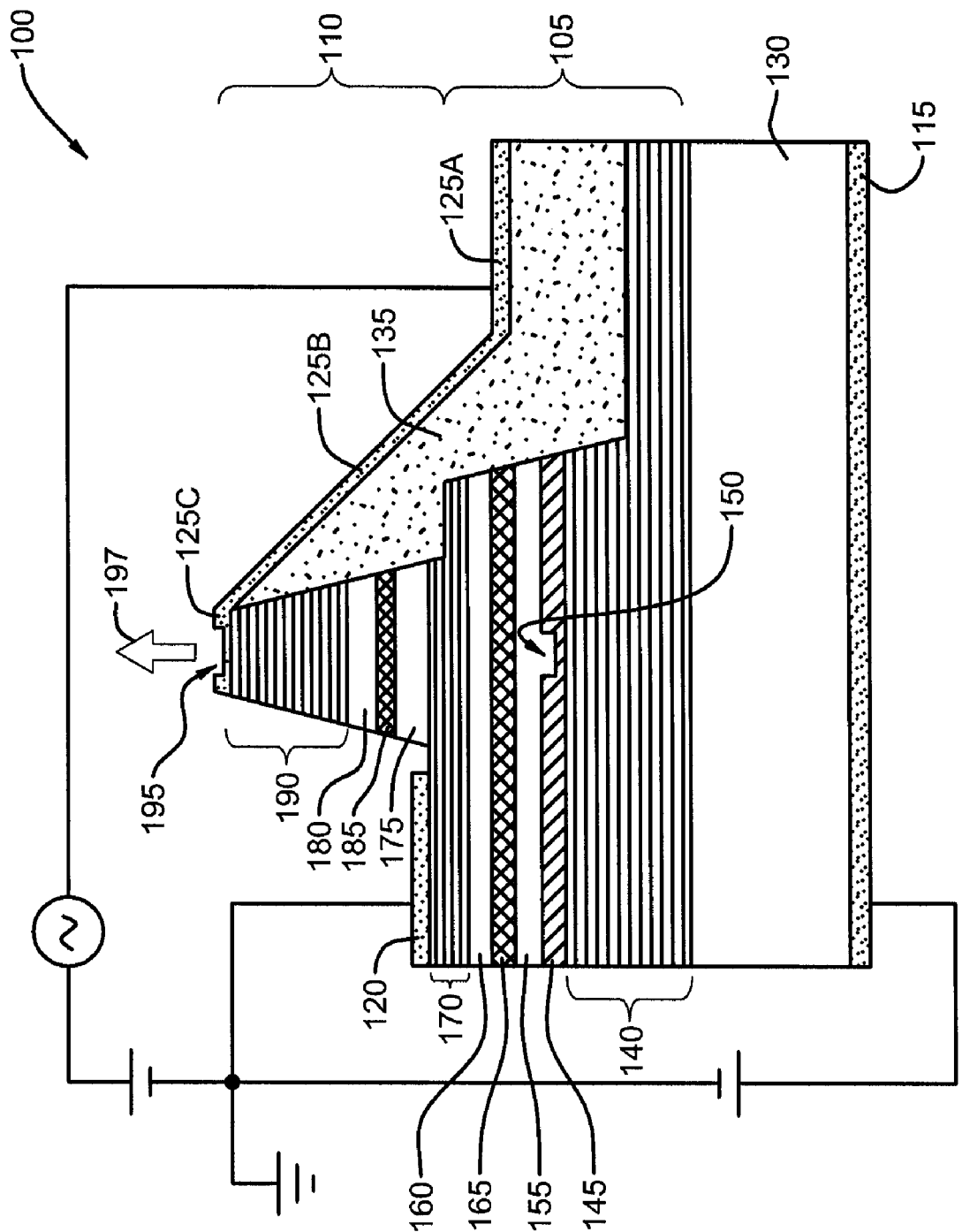
FIG. 4 is a cross-sectional perspective view of an electro-absorption vertical cavity surface emitting laser modulator and/or detector, in accordance with an aspect of the present invention.

FIG. 4 is a cross-sectional perspective of an ODVM 100, in accordance with an embodiment of the present invention. Embodiments of ODVM 100 may be configured to operate as either an optical source or an optical detector, as described below. The word "detector" has been excluded from the ODVM label for convenience sake and it should not be implied that ODVM 100 is not capable of operating in an optical detector regime.

The illustrated embodiment of ODVM 100 includes a lower resonant cavity 105 (gain section) and an upper resonant cavity 110 (modulator section), a drive electrode 115, a ground electrode 120, signal electrodes 125A, B, C (collectively 125), a substrate layer 130, and a dielectric material 135. The illustrated embodiment of lower resonant cavity 105 includes a lower reflector 140, an oxide layer 145 having a confinement aperture 150 therein, barrier layers 155 and 160, a gain region 165 and a middle reflector 170. The illustrated embodiment of upper resonant cavity 110 includes middle reflector 170, barrier layers 175 and 180, an absorber region 185, upper reflector 190, and a surface aperture 195.

In one embodiment, during an optical source regime of ODVM 100, lower and upper resonant cavities 105 and 110 of ODVM 100 are weakly coupled micro-cavities, which together provide the functionality of an optical source and optical modulator, respectively, integrated into a single semiconductor die. Additionally, during an optical detecting regime of ODVM 100, gain region 165 may be disabled via appropriate biasing and absorber region 185 operated to detect an optical signal impinging upon surface aperture 195.

In one embodiment, substrate layer 130 is one layer of a semiconductor die, such as a gallium arsenide (GaAs) based semiconductor die, a silicon based semiconductor die, various other type III-V semiconductor materials, type IV semiconductor materials, or the like. In one embodiment, substrate layer 130 is an n-type doped GaAs substrate.

In the illustrated embodiment, lower, middle and upper reflectors 140, 170 and 190 are distributed Bragg reflectors (DBRs) including alternating layers of GaAs and AlGaAs. In one embodiment, lower reflector 140 is almost fully reflective at the carrier wavelength of emitted optical signal 197, while middle and upper reflectors 170 and 190 are at least partially reflective to encourage lasing and partially transmissive to emit optical signal 197. The attributes of lower resonant cavity 105 may be selected for coarse resonance tuning of a carrier wavelength generated by gain region 165, while the attributes of upper resonant cavity 110 may be selected for fine resonance tuning of the carrier wavelength and to provide for adequate weak coupling between upper and lower resonant cavities 105 and 110. The thickness of each alternating layer within the reflector may be chosen to select a desired center resonance frequency and therefore nominal carrier wavelength of optical signal 197 emitted from ODVM 100. In one embodiment, where the carrier wavelength is selected to fall between 850 nm and 900 nm, the alternating layers of lower and middle reflectors 140 and 170 may have quarter full wavelength thicknesses to place the Bragg wavelength of lower and middle reflectors 140 and 170 at the desired carrier wavelength.

In one embodiment, lower, middle and upper reflectors 140, 170 and 190 are doped to establish p-n junctions within upper and lower resonant cavities 105 and 110. For example, lower and upper reflectors 140 and 190 may be doped to have an n-type conductivity while middle reflector 170 may be doped to a p-type conductivity, thereby creating an n-i-p-i-n structure. Of course, lower, middle and upper reflectors 140, 170 and 190 may also be doped to create a p-i-n-i-p structure with a corresponding polarity change in the bias voltage/signals applied to electrodes 115, 125, and 130 (discussed below).

In one embodiment, the lower reflector contains a tunnel $p^+-n^+$ junction fabricated on an n-type substrate. The middle and upper reflectors are $n^-$ and $p^-$ doped, respectively, to create n-($n^+-p^+$)-p-n-p structure counting from the substrate. This design allows for reduced optical losses in the laser cavity due to mostly n-doping of the laser cavity reflectors, and also reduced series resistivity of the device resulting from an n-type middle lateral contact.

Figure 5:
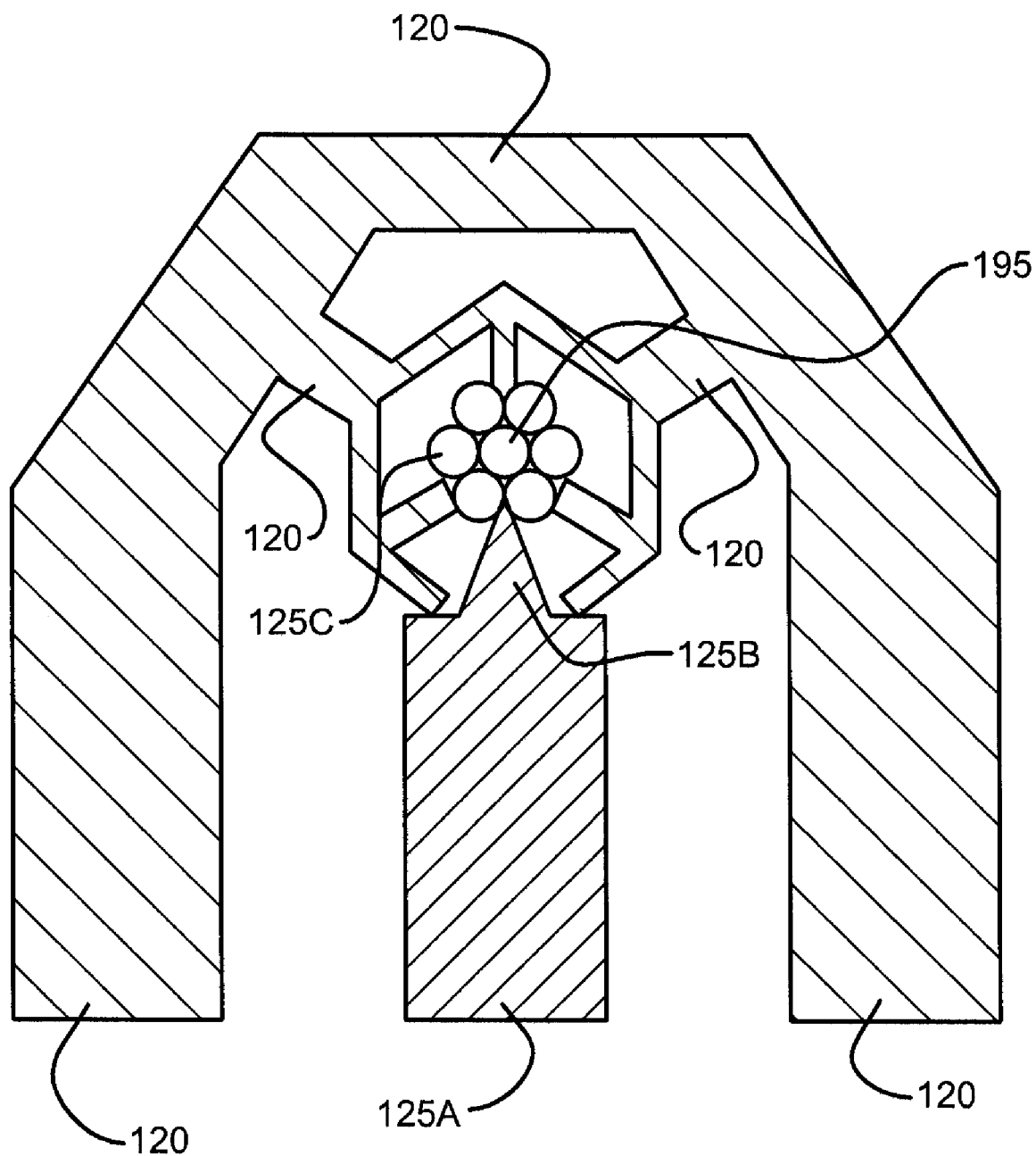
FIG. 5 is a top perspective view of an electro-absorption vertical cavity surface emitting laser modulator and/or detector, in accordance with an aspect of the present invention.

FIG. 5 is a top view perspective of an ODVM 100, in accordance with an embodiment of the invention. Ohmic contacts 115 (see FIG. 4), 120 and 125 may be fabricated of a variety of electrically conductive materials. In one embodiment, drive electrode 115 and signal electrode 125 are made of NiAuGe to form an electrical contact with n-doped substrate layer 130 and an n-doped upper reflector 190, while ground electrode 120 is made of PdTiAu to form an electrical contact with p-doped middle reflector 170. In one embodiment, a metallization layer is formed with CrAu. Other conductive materials may also be used.

Returning to FIG. 4, during the optical source regime of operation, a direct current (DC) voltage may be applied between drive electrode 115 and ground electrode 120 to forward bias gain region 165 and supply a DC drive current thereto for generating the carrier wave. A second DC bias voltage may also be applied between signal electrode 125 and ground electrode 120 to reverse or slightly forward bias absorber region 185. In addition, an alternating current (AC) signal voltage may be superimposed onto the second DC voltage to modulate the optical absorption properties of absorber region 185, thereby modulating the optical carrier wave with the signal voltage and generating optical signal 197. In one embodiment, the modulation of the optical carrier wave is an amplitude modulation. During the optical detecting regime of operation, drive electrode 115 may be biased to turn off gain region 165, while signal electrode 125 is biased to maintain absorber region 185 in a reverse biased state.

Oxide layer 145 provides an electrical and optical barrier layer. Confinement aperture 150 defined in oxide layer 145 provides a sort of beam shaping function using both current and optical confinement. Oxide layer 145 has a lower index of refraction than confinement aperture 150 and beneath surface aperture 195. Furthermore, oxide layer 145 is an electrical insulator that restricts the DC drive current between drive electrode 115 and ground electrode 120 to flow through confinement aperture 150. By restricting the DC drive current to flow through confinement aperture 150, the stimulated emission is laterally concentrated (high carrier densities) in gain region 165 above confinement aperture 150 and below surface aperture 195. In one embodiment, oxide layer 145 is formed of Al(Ga) oxide and a wet selective oxidation technique is used to form confinement aperture 150. It should be appreciated that other electrical and optical barrier materials and fabrication techniques may be substituted. For example, another oxide layer with a confinement aperture may be placed above gain region 165, or two or more oxide layers with confinement apertures may be used above and/or below gain region 165 to increase the optical field and/or current confinements. In one embodiment, confinement aperture 150 is approximately 6 μm in diameter.

Barrier layers 155 and 160 surround gain region 165 and act to increase injection efficiency into gain region 165 from the surrounding material layers. In one embodiment, barrier layers 155 and 160 are formed of AlGaAs, while gain region 165 is formed of InGaAs, GaAs, or other optically active materials. Similarly, other material constituents may be used to form barrier layers 155 and 160. In one embodiment, barrier layers 155 and 160 are approximately 50 nm thick, and the total thickness of barrier layers 155 and 160 and gain region 165 is equal to a half-wavelength or one wavelength in the material. The thickness of barrier layers 155 and 160 may be adjusted to adjust the resonant frequency of lower resonant cavity 105.

Gain region 165 acts as a gain medium to emit and amplify the optical carrier wave. Gain region 165 is driven by the DC current to create a charge carrier population inversion within gain region 165 and thereby establish conditions favorable for stimulated emission. The DC drive current is generated by applying an appropriate bias current between drive electrode 115 and ground electrode 120. In one embodiment, stimulated emission is created by forward biasing gain region 165 with drive electrode 115 and ground electrode 120.

Gain region 165 may be formed of a variety of optically active materials, including, for example, layers of InGaAs or GaAs with AlGaAs barriers. Gain region 165 may be constructed as a multi-layer quantum dot (MQD) structure or a multi-layer quantum well (MQW) structure. An MQD structure provides three-dimensional carrier confinement, while the MQW structure provides one-dimensional carrier confinement.

Figure 6:
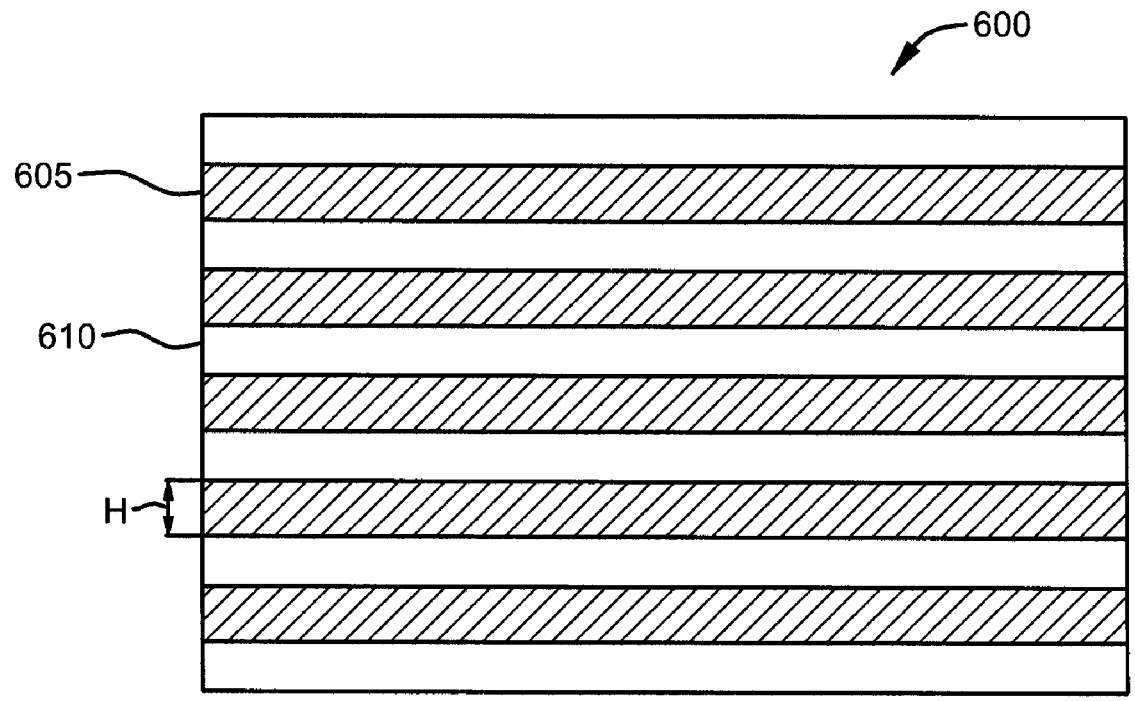
FIG. 6 is a cross-sectional perspective illustrating a multiple quantum well structure, in accordance with an aspect of the present invention.

FIG. 6 is a cross-sectional perspective illustrating a MQW structure 600, in accordance with an embodiment of the present invention. Gain MQD structure 600 may be formed, by way of example, employing quantum dots. Quantum dots are pyramid-like quantum structures formed in a substantially planar array, though other three dimensional shapes may be implemented. Quantum dots are fabricated in one material and surrounded by a second mortar material. In one implementation, quantum dots are formed with InGaAs, while the surrounding mortar material is AlGaAs. Quantum dots may be evenly distributed or randomly distributed. In forming a MQD or MQW structure, several layers of a planar array of quantum dots may be stacked on top of each other (for example, 2-10 layers). In one embodiment, MQW structure 600 includes an alternating stack of five InGaAs layers 605 and six AlGaAs layers 610 in a second mixing proportion. Other materials and number of layers may also be used.

Figure 7:
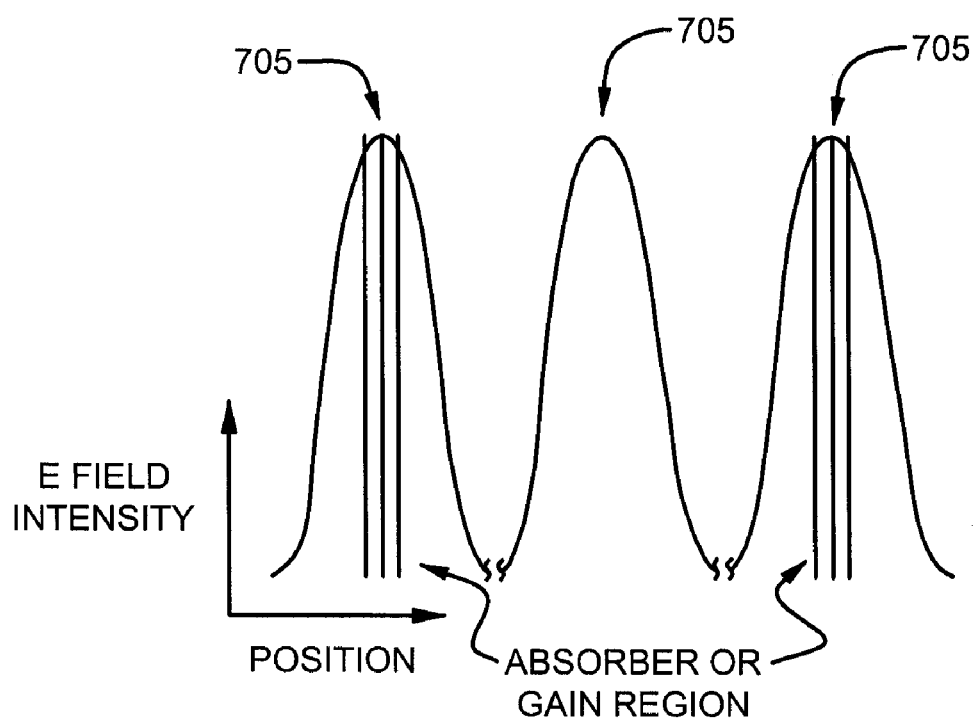
FIG. 7 is a diagram illustrating physical position of an absorber region and/or gain region within a resonant cavity, in accordance with an aspect of the present invention.

The MQW structure of FIG. 6 may be used to implement absorber region 185, as well as, gain region 165. These structures act to confine charge carriers at positions within lower resonant cavity 105 and upper resonant cavity 110 where the electric field intensity is highest (i.e., in the antinodes of the standing wave), as illustrated in FIG. 7. By positioning gain region 165 and absorber region 185 at E-field intensity peaks 705 within lower and upper resonant cavities 105 and 110, the quantum efficiency of these structures is improved and the modulation contrast/gain efficiency increased.

Continuing with FIG. 4, absorber region 185 may be formed of a variety of optically active materials, including, for example, a superlattice of InGaAs and GaAs. As discussed above, this superlattice may be constructed using an MQD structure or an MQW structure. Barrier layers 175 and 180 surround absorber region 185 and act to buffer absorber region 185 from the surrounding material layers and form half-wavelength thick or integer multiples half-wavelength thick structures with absorber region 185. In one embodiment, barrier layers 175 and 180 are approximately 50 nm thick and form a p-i-n structure with absorber region 185. The dimensions of upper and lower resonant cavities 105 and 110 along with the thickness of middle reflector 170 determine resonant modes within ODVM 100 and the amount of coupling between upper and lower resonant cavities 105 and 110. In one embodiment, the thickness of the constituent layers can be controlled by change of growth rates or growth time in the molecular beam epitaxy or metal-organic chemical vapor deposition reactors commonly used to fabricate semiconductor epitaxial heterostructures.

Surface aperture 195 may be patterned in a variety of shapes, including a circle, as illustrated in FIG. 5, to provide uniform vertical current flow and to reduce the effect on optical signal 197 and to further beam shape optical signal 197. In one embodiment, surface aperture 195 has a diameter of approximately 15 μm, while EAVM 100 has an approximate overall height of 10 μm from the bottom of lower reflector 140 to the top of surface aperture 195.

Finally, dielectric material 135 may be formed between the inner components of ODVM 100 and signal electrode 125 for planarization, mechanical protection, and electric insulation. In one embodiment, dielectric material 135 is a reflowable polymer material.

In the case of a vertical cavity device, a single pass external modulator provides very low contrast ratio (on/off ratio) due to the small total thickness of the modulator employed. In the case of electro-absorption quantum well (QW) (or Quantum Defined Stark Effect (QCSE)) base modulators, hundreds of QWs can be employed to obtain an adequate contrast ratio. A typical single pass 250×QW modulator may require a swing voltage of 30 V to achieve a contrast ratio of 8:1 (9 db). Improved contrast ratio at a reduced applied voltage can be achieved in multiple pass schemes by placing a QCSE modulator in a cavity. This results in a dual-cavity device with interesting optical properties which have stimulated numerous applications including stabilization of single-mode operation, two-frequency operation, and even terahertz electromagnetic wave generation using external photomixing.

Figure 8A:
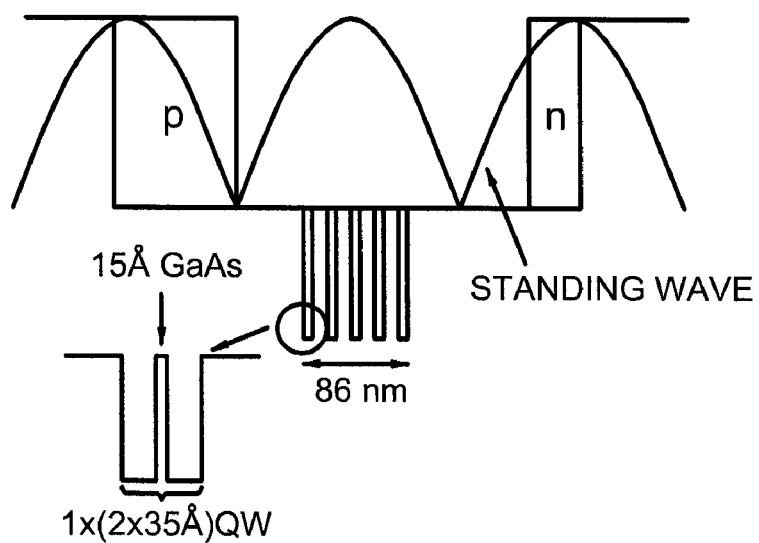
FIG. 8A is a diagram of a Quantum-Confined Stark Effect modulator cavity, illustrating an overlapped cavity standing wave, in accordance with an aspect of the present invention.

Design of a high-contrast QCSE modulator can be controlled to obtain a reasonable modulation contrast of the device. A modulator has been developed for an intracavity VCSEL-modulator emitter which provides ~0-1% single pass absorption. (Reference N. Debbar et al., "Coupled GaAs/AlGaAs quantum-well electroabsorption modulators for low-electric-field optical modulation", J. Appl. Phys., Vol. 65, pp. 383-385, 1989.) In one embodiment, such a modulator includes five pairs of coupled 3.5 nm InGaAs QWs separated with 1.5 mm barriers as shown in FIG. 8A. A coupled-QW structure is chosen to maximize the electric field dependence of exciton absorption wavelength. By selecting the dimensions of the coupled quantum well, the lowest heavy-hole exciton peak moves at a rate ~2.5 faster than in a square well. Thus, a strong modulation is obtained at much lower swing of electric fields.

Figure 8B:
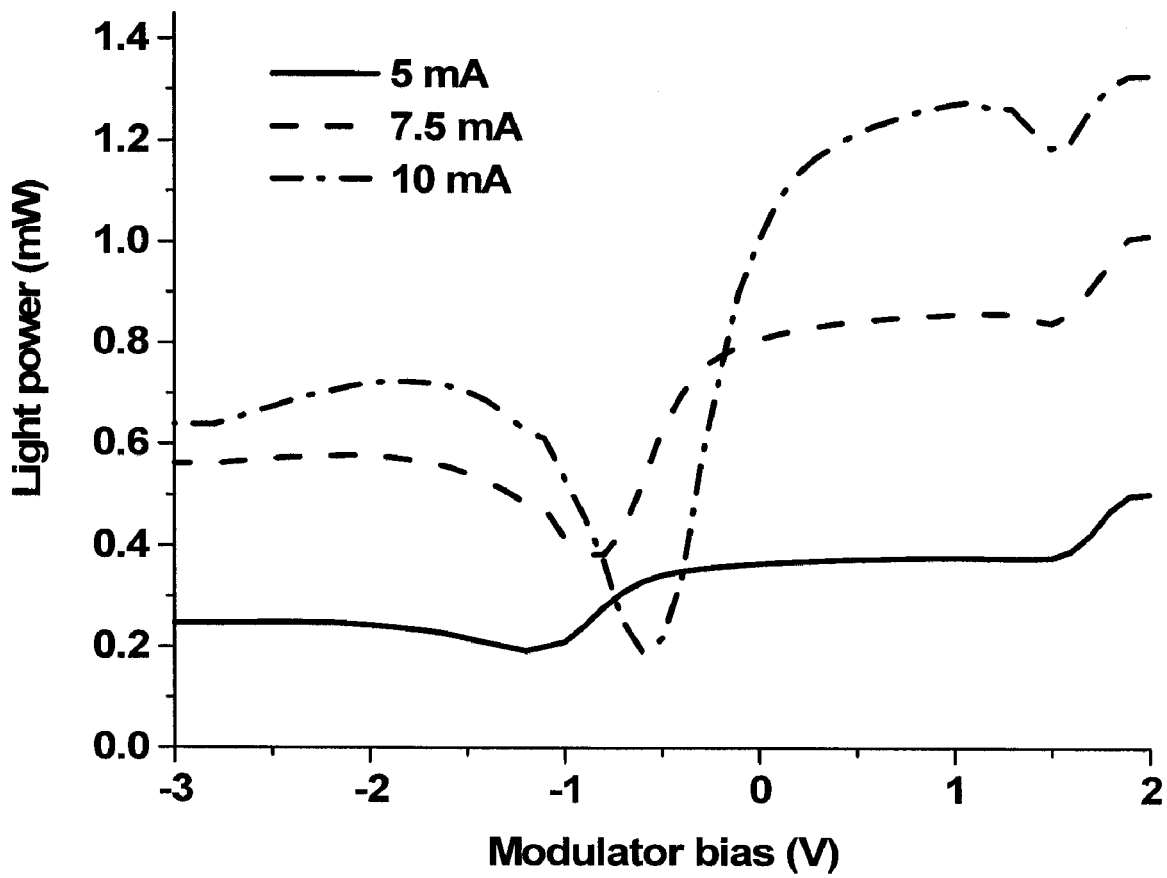
FIG. 8B graphically illustrates DC output power versus modulator bias for three different injection currents for an intracavity VCSEL-modulator lasing at 924 nm, with the modulator excitonic peak blue-shifted to 910 nm, in accordance with an aspect of the present invention.

Another aspect to be considered is the position of exciton resonance with respect to the laser wavelength determined by a VCSEL cavity. By red-shift of the exciton resonance, it is possible to increase the modulation contrast, but the modulator diode will have to operate at close to zero or slightly positive bias. This reduces the speed of operation due to time-of-flight delay. On the other hand, a blue-shifted modulator, though very fast requires a larger voltage swing to operate and shows lower contrast. Experimental work on VCSELs with an intra-cavity modulator has resulted in an optimum 14 nm blue-shift of the exciton absorption peak with respect to the laser line (e.g., lasing at 924 nm). DC optical characteristics of an intra-cavity VCSEL-modulator for three injection currents are shown in FIG. 8B. As shown, the maximum slope and hence, the operation point for the modulator is approximately −0.2V, which is low enough to maintain strong dependency of peak absorption wavelength on applied bias (~14 mm/V in −0.5V to 0.5V corresponding to 50 kV/cm swing), and high enough to obtain low parasitics (allowing ~20 Ghz operation) due to time-of-flight delay.

Figure 9:
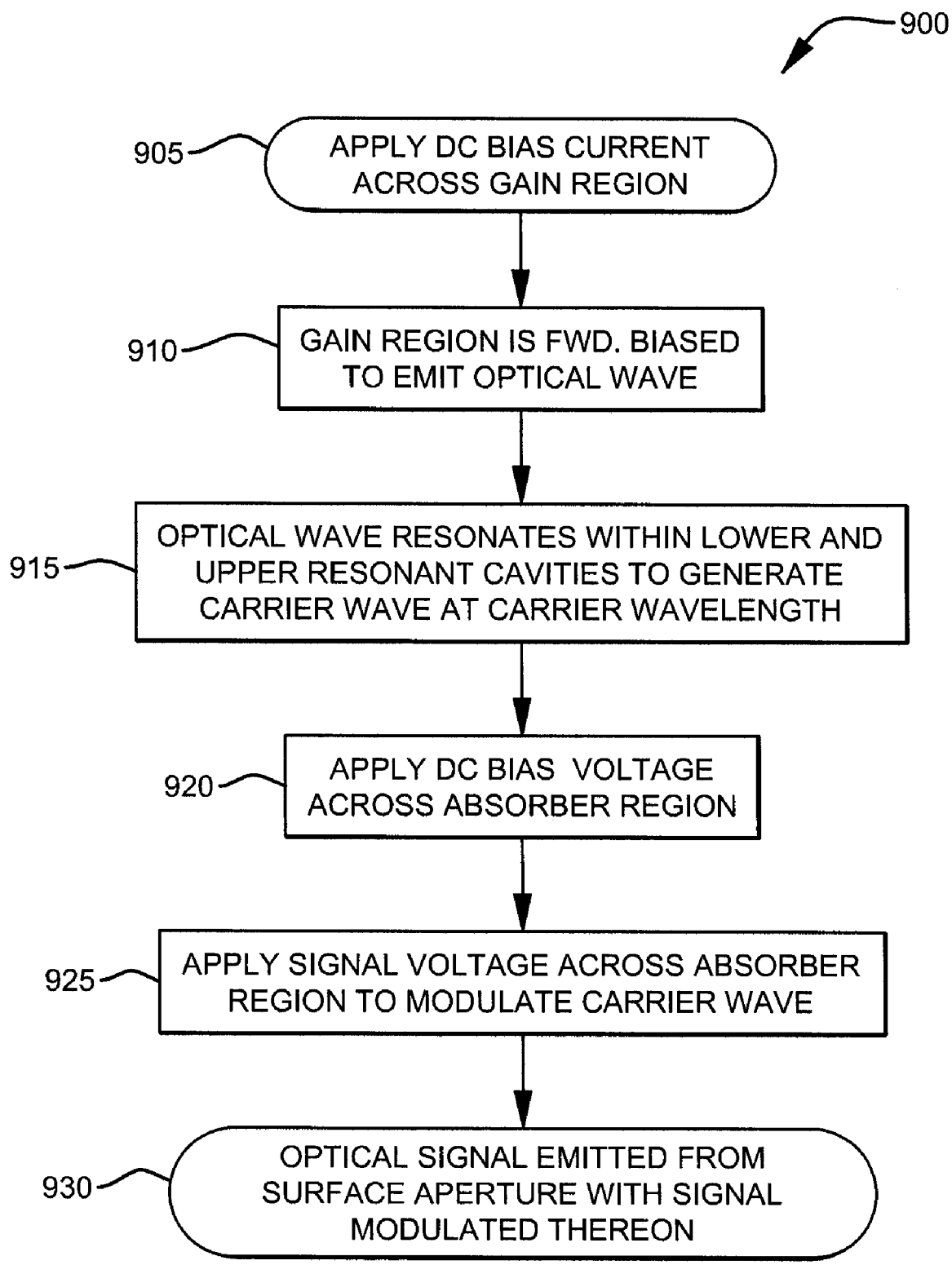
FIG. 9 is a flowchart illustrating a process for operation of an electro-absorption vertical cavity surface emitting laser modulator and/or detector in an optical source regime, in accordance with an aspect of the present invention.

FIG. 9 is a flowchart illustrating a process 900 for operation of ODVM 100 (FIG. 4) in the optical source regime, in accordance with an aspect of the present invention. The order in which some or all of the process blocks appear in each process below should not be deemed limiting. Rather, one of ordinary skill in the art having the benefit of the present disclosure will understand that some of the process blocks may be executed in a variety of orders not illustrated.

In process block 905, the DC bias current is applied through drive electrode 115 (see FIG. 4) and across gain region 165 to ground electrode 120. The DC bias current and associated DC bias voltage forward biases gain region 165 resulting in stimulated emission of an optical wave by gain region 165 (process block 910). In process block 915, the optical wave resonates within lower and upper resonant cavities 105 and 110 resulting in lasing at the carrier wavelength (process block 915). In process block 920, a DC reverse bias voltage is applied across absorber region 185 between signal electrode 125 and ground electrode 120. In process block 925, a signal voltage containing the electrical signal to be modulated onto the optical carrier wave is superimposed on the DC reverse bias voltage. The signal voltage applied across absorber region 185 results in a corresponding modulation of the absorption coefficient of absorber region 185 due to the Quantum Confined Stark Effect (QCSE).

QCSE is a phenomenon which arises when an electric field is applied across the plane of hetero-structure superlattices (e.g., the MQD and the MQW described above). In a quantum well at zero electric field, the electron and hole quantized energy levels are defined by the well width, stress within the quantum structure, and the band gap energy of the materials used to form the quantum well and the barrier. The electrons and holes occupy quantized energy states at least in one direction. When an electric field is applied, the electrons and holes are forced apart and their quantized energy states are altered. This has the effect of shifting the absorption resonance, as well as, modulating the strength of absorption (i.e., absorption coefficient). From a quantum mechanical perspective, if a photon having sufficient energy passes in the vicinity of a quantum well, there is a statistical probability that direct optical absorption of the photon by an electron in the valence band of the quantum well will occur, thereby raising the electron from the valence band into the conduction band, otherwise known as the formation of an exciton or electron-hole pair. Modulation bandwidths achievable via the QCSE are in principle much higher than the modulation bandwidths achievable by directly modulating the excited state population of gain region 165. For example, absorber region 185 may be modulated at 100 GHz and higher.

In one embodiment, ODVM 100 is a tunable optical source capable of amplitude modulation at different optical wavelengths. As mentioned above, applying a voltage modulation across absorber region 185 not only modulates the optical absorption coefficient of absorber region 185 (amplitude modulation), but also modulates the index of refraction of absorber region 185 (or the absorption resonance wavelength). The absorption coefficient and the index of refraction are related by what is called the Kramers-Kronig relation. Accordingly, the nominal or center wavelength of absorption of absorber region 185 may be tuned by varying the DC reverse bias voltage applied across signal electrode 125 and ground electrode 120. Therefore, bias applied to absorber region 185 is used to control absorption losses in the mode and the value of coupling between the gain region 165 and absorber region 185. Additionally, at the time of fabrication, the geometry (e.g., Bragg wavelength and cavity length) of lower and upper resonant cavities 105 and 110 may be selected to select different wavelengths of operation (as explained above).

ODVM 100 may be used as a general electro-optic building block, which may be tailored for a variety of electro-optic applications, such as an optical detector. An optical detector can be made to be tunable by placing the optical detector within the cavity at particular wavelength, for half, or full multiples thereof, via constructive interference. By placing the optical detector at peak E-field intensity locations within the Fabry-Perot cavity, as illustrated in FIG. 7, the quantum efficiency of the optical detector is enhanced, since electrical carrier generation is proportional to photon density. When ODVM 100 is operated in the optical detector regime, upper resonant cavity 110 acts as a Fabry-Perot cavity to enhance and concentrate the photon density of received optical signal 197 between upper reflector 190 and middle reflector 170. In one embodiment, absorber region 185 is positioned within upper resonant cavity 110 to coincide with one of E-filed intensity peaks 705 (FIG. 7).

Figure 10:
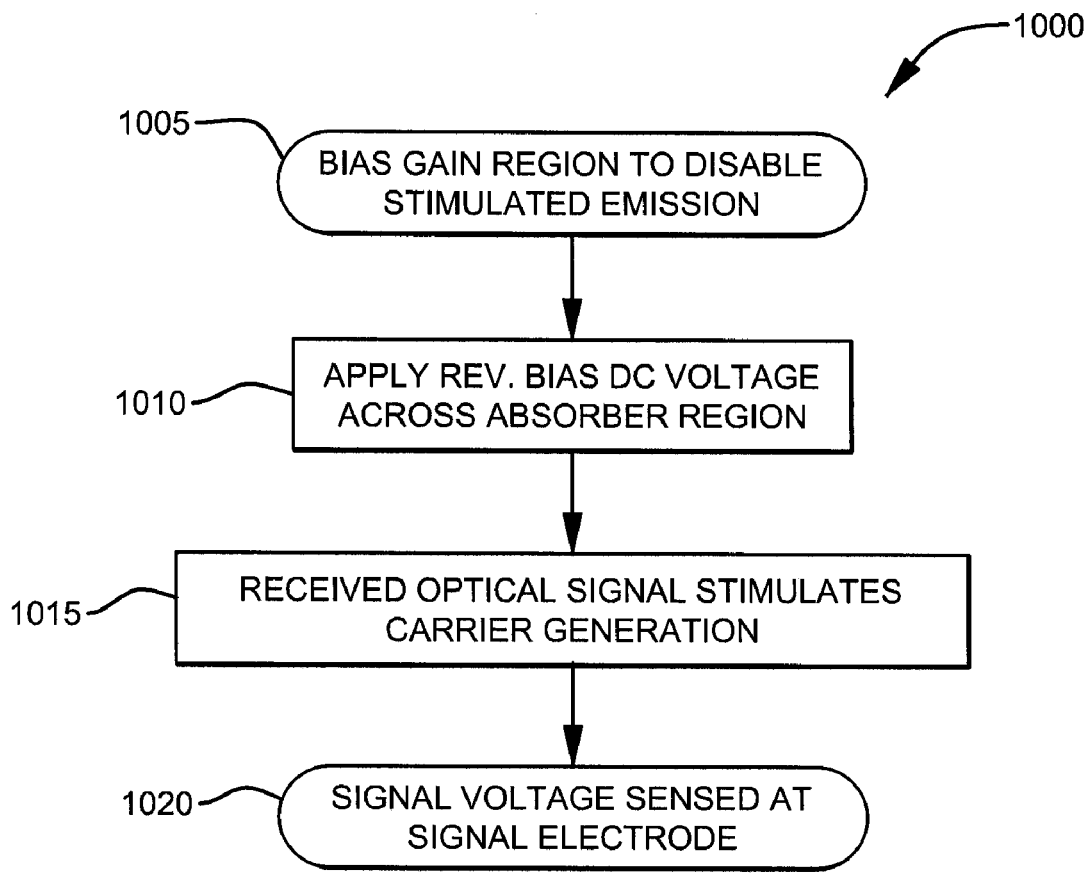
FIG. 10 is a flowchart illustrating a process for operating an electro-absorption vertical cavity surface emitting laser modulator and/or detector in an optical detector regime, in accordance with an aspect of the present invention.

FIG. 10 is a flowchart illustrating a process 1000 for operating ODVM 100 (FIG. 4) in an optical detector regime, according to an aspect of the present invention. In process block 1005, gain region 165 is disabled to prevent lasing by application of an appropriate DC bias voltage (for example, not forward biased or left unbiased). In process block 1010, absorber region 185 is reverse biased by application of a DC reverse bias voltage across signal electrode 125 and ground electrode 120. In process block 1015, optical signal 197 is received through surface aperture 195 and resonates within upper resonant cavity 110. The resonance of received optical signal 197 results in electrical carrier generating within absorber region 185. The generated electrical carriers within absorber region 185 create a signal voltage, which is sensed at signal electrode 125 and extracted as a received electrical signal (process block 1020).

The active, passive and DBR layers of ODVM 100 (FIG. 4) may be fabricated using known molecular beam epitaxy (MBE) and metal-organic chemical vapor deposition (MOCVD) techniques, as well as others. Furthermore, ODVM 100 may be fabricated in a single epitaxial run to deposit both gain region 165 and absorber region 185 on a single semiconductor die, as a monolithically integrated device. Upper reflector 190 may be fabricated using a "quarter-wavelength thick" dielectric stack, which is deposited on top of signal electrode 125.

Advantageously, ODVM 100 may be used to optically interconnect a variety of different electronic circuits residing on the same semiconductor die, residing on different semiconductor dies (chip-to-chip), residing on different circuit boards (board-to-board and blade-to-blade), residing within different systems (system-to-system), or residing within different compute centers (rack-to-rack), as well as others.

FIGS. 11A-16 are referenced herein below by way of further explanation of the proposed technique for suppressing optical feedback change in high-bandwidth transmitters employing a continuous wave laser with external modulation. As noted above, the technique is based on a property of a resonant cavity wherein change of both width and depth of the reflection resonant dip with variation of the cavity loss is recognized. This property allows for a substantially constant reflection of the wave from the cavity at a particular frequency (or wavelength) if the cavity loss changes, but results in changing transmission of the cavity. To realize the technique, the laser wavelength is detuned from the resonant wavelength of the modulator cavity by a sufficient amount, for example, the laser cavity and modulator cavity may have resonant wavelengths detuned in a range of 1-30 nm, depending upon the Q-factors of the cavities.

Figure 11A:
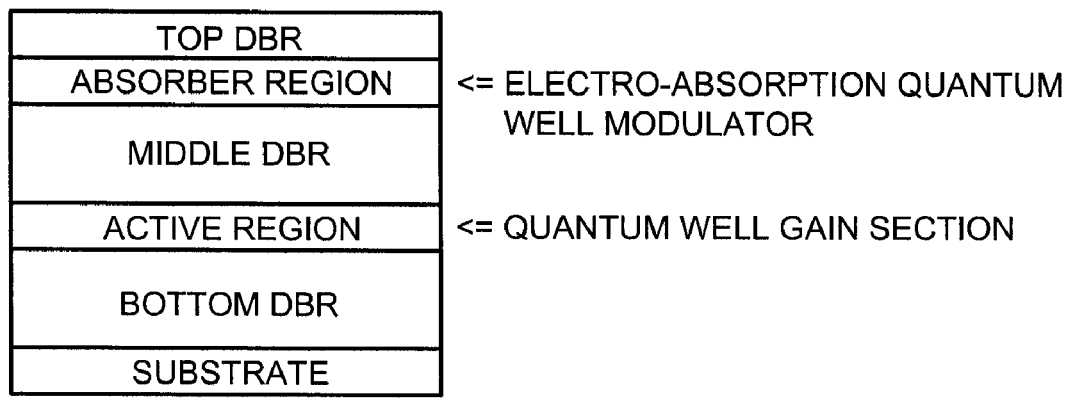
FIG. 11A is a high level depiction of a detuned duo-cavity laser-modulator device, such as a weakly-coupled VCSEL-modulator device, in accordance with an aspect of the present invention.

FIG. 11A is a high level depiction of a weakly-coupled VCSEL-modulator, such as described herein above. In the figure, the absorber region is assumed to comprise an electro-absorption quantum well modulator and the active region a quantum well gain section. The proposed dual-cavity device includes a laser cavity, including the bottom and middle distributed brag reflectors (DBR) and a modulator cavity including the middle and upper DBRs. Again, the laser and modulator cavities have slightly detuned resonant wavelengths, as described herein.

Figure 11B:
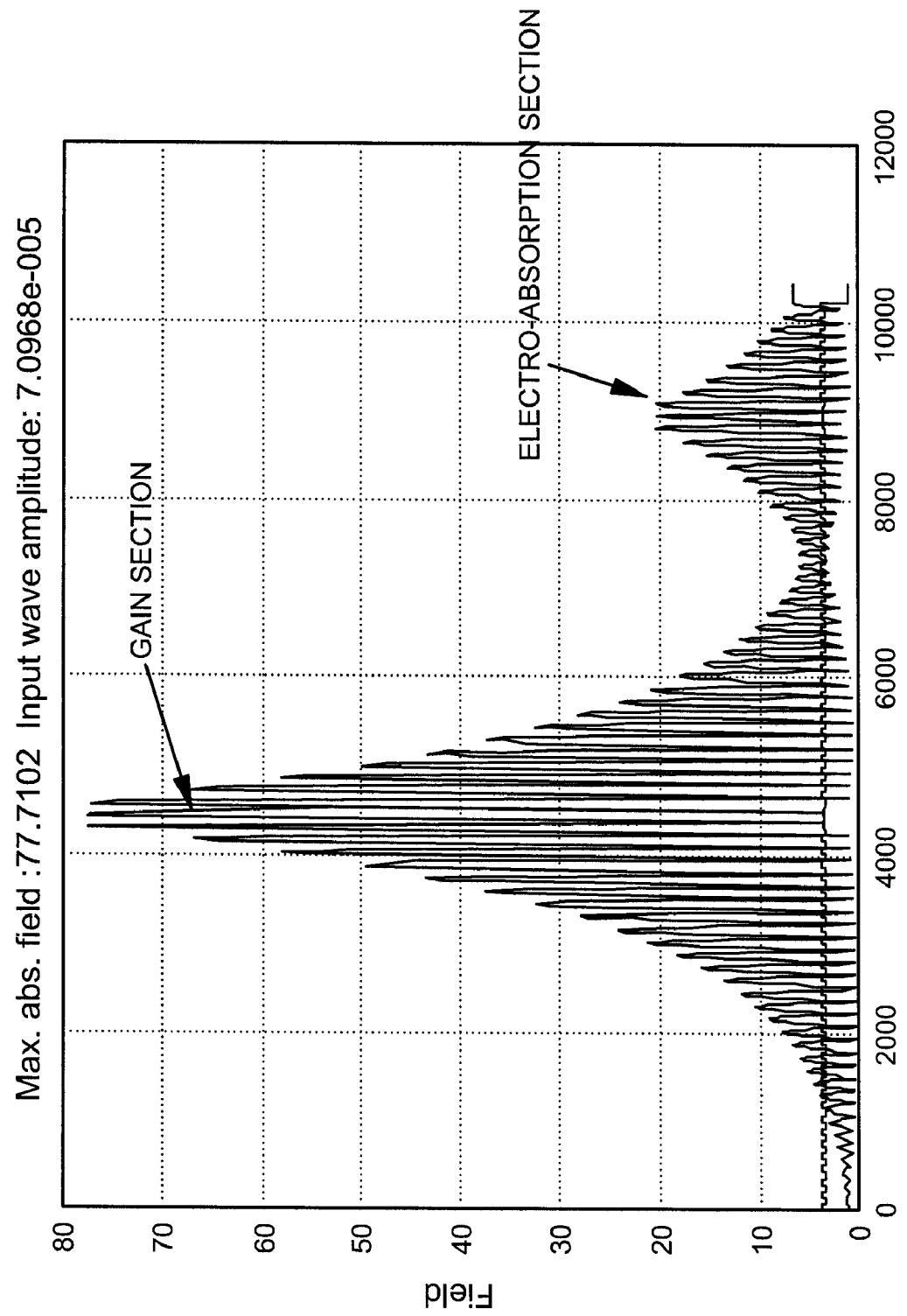
FIG. 11B is a graph of distance versus optical field strength for a duo-cavity VCSEL-modulator device such as depicted in FIG. 11A, in accordance with an aspect of the present invention.

FIG. 11B is an example of single dimension field simulation in a duo-cavity VCSEL-modulator. A multiple quantum well gain medium is placed in the antinode of the standing optical wave of the VCSEL section. A single or multiple quantum well electro-absorption module is placed in the antinode of the standing optical wave of the modulator section. The number of layers and index contrast of the DBRs are adjusted to match gain with losses in the electro-optical absorber and provide a necessary modulation contrast. The ratio of the fields in the gain or modulator sections are determined by the number of quarter-wavelength periods in the DBR and may be optimized for a given gain-absorption ratio.

Figure 12:
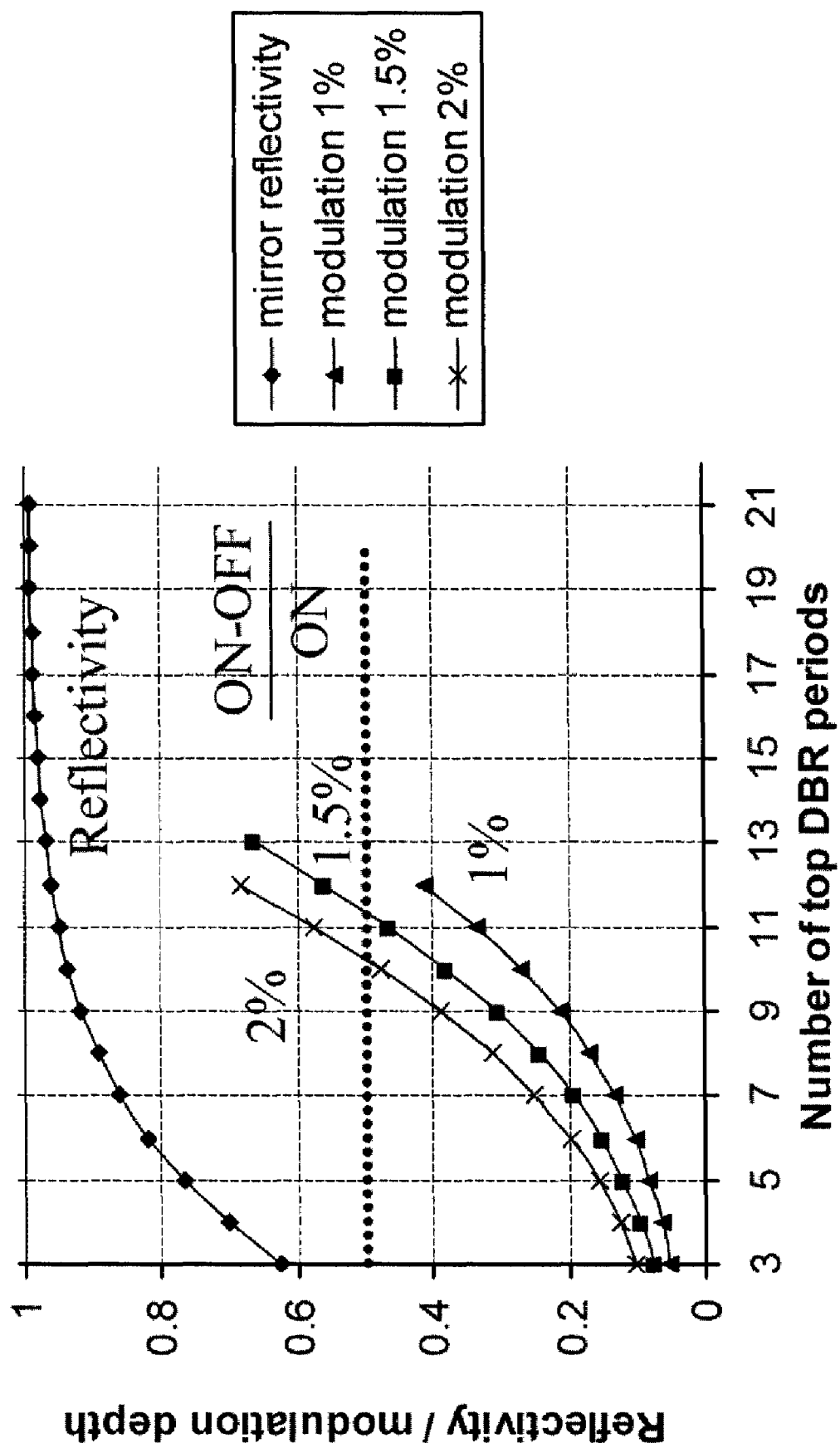
FIG. 12 is a graph of reflectivity and estimated modulation depth of a Fabry-Perot cavity with an absorber-modulating single-pass absorption from 0 to 1-2%, in accordance with an aspect of the present invention.

The enhancement of the modulation cavity field over that of the exit wave determines the modulation contrast to the device. This is shown in FIG. 12 for three single-pass absorption coefficients of the modulator section and thick (>20 pairs) middle DBR. It is clear that to obtain 6 db modulation contrast (0.75 modulation depth in FIG. 12), one needs to use a high contrast QCSE modulator and >10 DBR periods in the top reflector. In FIG. 12, modulation depth is determined by the number of passes through the absorber and per-pass absorption. The configuration depicted assumes 9 periods in the top cavity, with modulation ~1% corresponding to 20% modulation depth. Adding a set of MQW brings the modulation depth to 40%. Adding one period (10 total on both sides of the cavity) brings modulation depth to ~50%.

In addition, since the gain of the VCSEL is limited by 1-2% per round trip in MQW structures, there is a trade-off between the modulation depth, which can be increased if the absorber is placed into a high-Q cavity, and accuracy of detuning of the two cavities, which is difficult to achieve due to both technological variations and intrinsic wavelength shifts caused, for instance, by Kramers-Kronig refractive index modulation. As the device performance is based on precise detuning of two resonant cavities, the effect of process variations and operation point variations on the characteristics of the device should be considered. A change in drive current or bias voltage across the junctions will change the refractive index of the active region and modulator section, respectively. The accompanying spectral shift of the resonances of both cavities may be detrimental to device operation characteristics, such as the optical alignment of both cavities with respect to each other needed for decoupled operation.

Modulation of absorption from a Fabry-Perot cavity at "constant reflection points", as depicted in FIG. 3, may result in modulation of the phase ($\Delta\phi$) of the reflected wave. This phase determines the effective length of the laser cavity and, consequently, will produce modulation of the resonant frequency or frequency chirping. An asymmetric Fabry-Perot cavity containing a top DBR with 10 periods and single pass absorption in the OFF state of 1% (FIG. 12) will provide a phase modulation of as low as $\Delta\phi \approx 3\times 10^{-4}$ rad. Since the effective length of the VCSEL cavity may be about $5\lambda$ due to wave penetration into DBRs, the effective resonant shift will be approximately twice as large $\Delta\lambda \approx 2\lambda\Delta\phi/2\pi = 0.8$ A. A direct simulation of the laser wavelength using field solver gives even weaker laser wavelength modulation. Though these values are close to VCSEL mode width, this parasitic modulation can be reduced even further through compensation by the refractive index modulation of the absorber discussed above.

Figure 13:
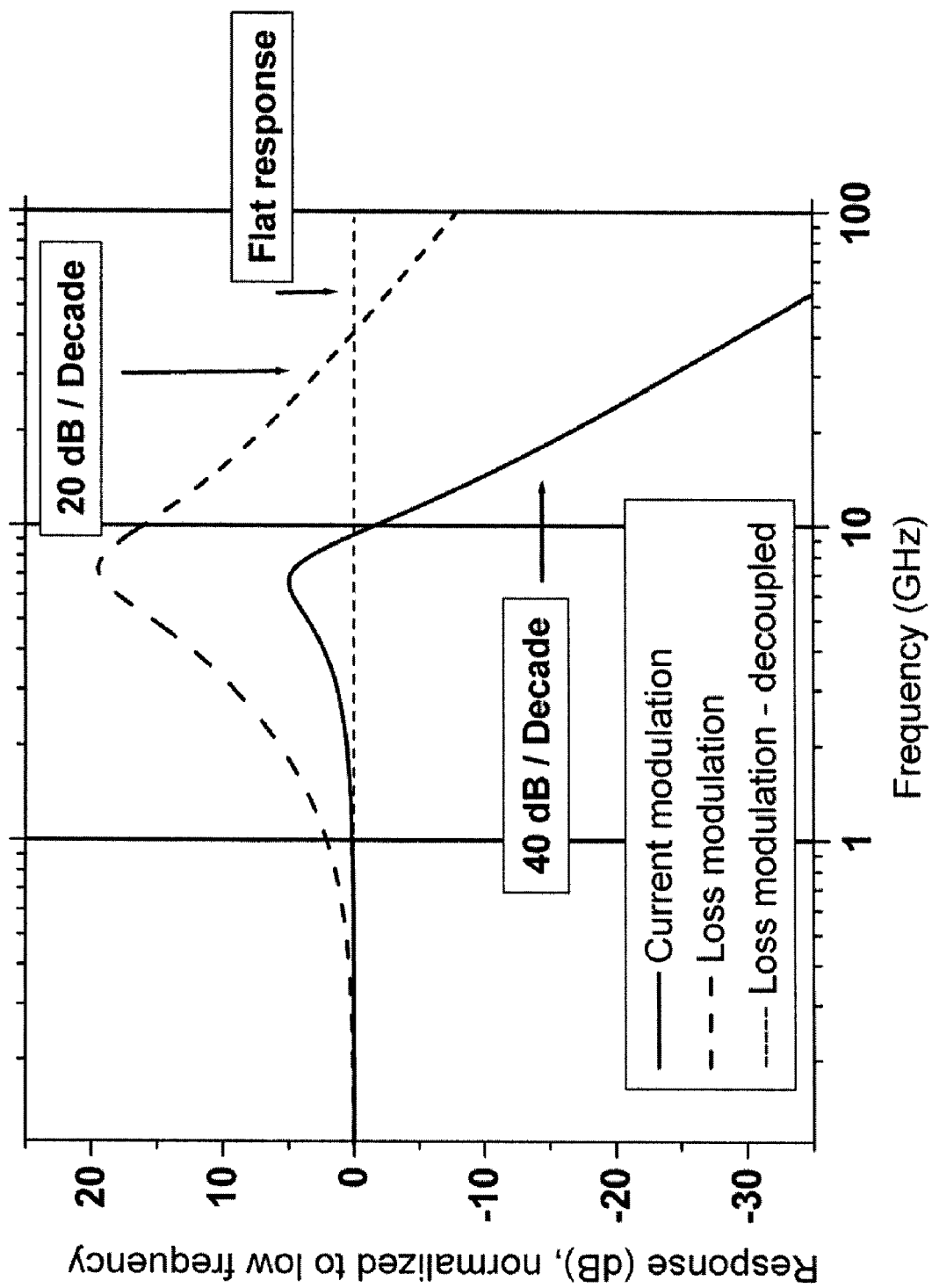
FIG. 13 is a plot of the modulation transfer functions of electric power on a photodetector for a current-modulated and a loss-modulated VCSEL having identical resonance frequency and damping coefficient, wherein a flat response is also shown for a decoupled VCSEL-modulator device presented herein, in accordance with an aspect of the present invention.

FIG. 13 depicts a plot of the modulation transfer function for devices with different modulation methods, namely for a current-modulated (solid line), single-cavity intra-cavity loss-modulated (dashed line) and duo-cavity decoupled laser-modulator (dotted line, flat response), all having identical relaxation resonance frequency and damping coefficient. The appearance of a large resonance peak at the optoelectronic relaxation frequency is not beneficial in the case of an optical source for data transmission. Also, measurements of the high frequency response of intra-cavity loss modulated devices shows a tendency to display actively Q-switched operation for high applied RF signal amplitudes. This effect is caused by an increased amount of feedback to the active region, since a change in photon lifetime in the VCSEL cavity directly influences the photon density visible by the gain medium. Analysis shows that improvement in modulation performance is difficult to achieve by simply replacing gain modulation by loss modulation in laser diodes. The flat response is possible for a decoupled VCSEL-modulator device such as described herein. Parasitics have been omitted for purposes of clarity.

To consider the effect of feedback from the modulator on the device frequency response, a differential equation can be used to solve coupled rate equations for both the modulator and gain sections. For small signal modulation, if the coupling between the gain section and modulator section is less than the detuning (resonance wavelength difference) in the duo-cavity device, the modulator cavity can be considered as a mirror with certain reflection and transmission with dominant real over imaginary parts. Then, the modulation response of the device obeys the following relation:

$$\text{Response} \sim (T_0 + \Delta T) \cdot (N_0 + \Delta N) - N_0 \cdot T_0 \approx T_0 \cdot \Delta N + N_0 \cdot \Delta T$$

where $N_0$, $\Delta N$ are DC photon density and change in photon density in the gain section, respectively, and $T_0$, $\Delta T$ are transmission and change in transmission of the output reflector (modulator section), respectively. If the change in photon density can be held to zero by keeping the reflection from the top cavity constant, then the measured response only depends on change in transmission. In this case, absorption and transmission of the upper cavity vary, while reflection is maintained constant. Initial spectral alignment is controlled through growth, but applied bias at the MQW modulator section allows adjustment of detuning between cavities by changing the top cavity resonance wavelength as needed.

Figure 14:
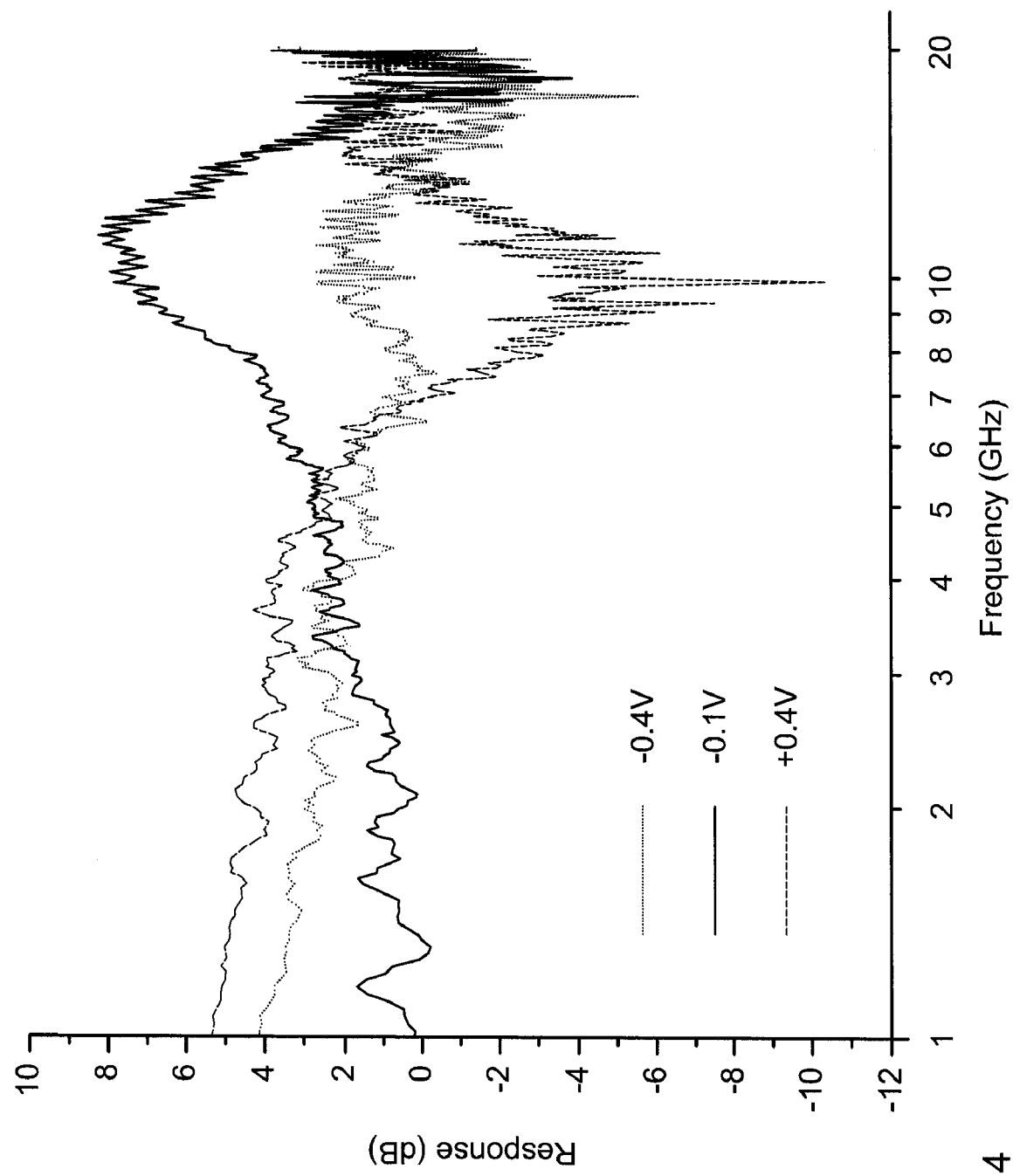
FIG. 14 illustrates the high frequency modulation response of a duo-cavity VCSEL-modulator emitter, showing positive and negative relaxation resonance, and almost flat response when the modulator bias is varied from +0.4 V to −0.4 V, in accordance with an aspect of the present invention.

The fact that the modulator cavity resonance changes with applied voltage is also needed to explain the high frequency behavior of the device. FIG. 14 shows the modulation responses for a dual-cavity VCSEL for three modulator bias points. The amount of feedback varies with applied DC bias resulting in a positive optoelectronic relaxation resonance feature, a flat response and a negative resonance. This behavior is explained by the above equation, where the relative phase of $\Delta T$ and $\Delta N$ can be changed from 0 to $\pi$ when the detuning between the two cavities crosses the point of constant reflection in FIG. 3. The graphs in FIG. 14 are a validation of the existence of the decoupling mechanism presented herein.

A widening of resonances for both cavities may reduce optical alignment sensitivity, but will likely require additional gain from the active region. Depending upon results with an $In_{0.18}Ga_{0.82}As/GaAs$ 4×QW design of the gain region, the gain may be increased by introducing a second (and possibly the third) 4×QW section separated by tunnel junctions. In such a case, each of the 2 or 3 gain sections may be placed in the antinode of the standing wave, and the geometrical cavity length will be increased to $3\lambda/2$ or $2\lambda$, where $\lambda$ is the optical carrier wavelength.

Special attention should be paid to preventing plastic relaxation of QWs in the strained gain medium, as the total thickness of InGaAs will be significantly increased in the multi-section gain structure. In fact, for 930 nm InGaAs QWs, four was found to be the maximum number of non-relaxed wells, and a 5×QW structure has shown $>10^4$ cm$^{-2}$ misfit dislocations. To increase the number of QWs, the Indium content in the wells may be reduced, or a larger number of GaAs/AlGaAs QWs may be employed.

As shown above, in one embodiment, the duo-cavity device contains DBRs, which may be significantly thicker than in a typical VCSEL, and also require a higher gain for operation. It is, therefore, clear that reasonable performance of the device requires a reduction of optical losses in the DBRs. One such approach is to include optimization of doping of the DBRs to reduce free-electron absorption (in particular in the regions where the optical field is maximum), reduction of roughness of the DBR interfaces to reduce scattering using control of MBE parameters (such as growth temperature and arsenic overpressure), and use of n-type instead of p-type DBRs due to smaller oscillator strength of electrons than holes in direct bandgap III-V compounds.

In the case of an intra-cavity VCSEL-modulator, a tunnel $n^+(10^{19}$ cm$^{-3})$-$p^+(10^{20}$ cm$^{-3})$ junction can be placed close to a minimum of the optical field in a GaAs quarter-wavelength layer of a bottom DBR to minimize the amount of p-doped material in the structure in order to reduce free carrier absorption. Also the middle DBR section becomes n-type, and serves as a low-resistance common ground electrode for both diodes (see FIG. 4).

A Molecular Beam Epitaxy (MBE) system may be employed to grow epitaxial structures for this device. The accuracy and reproducibility of growth required for thick multilayer epi-structures calls for specific methods of growth control and in-situ monitoring. This type of structure sets unique requirements to the growth technologies involved. Given typical total thickness of the structures of >10 µm operated in both short-scale electronic (within QW) and long scale photonic (Bragg reflector) domains, both short term and long term (tens of hours) stability and reproducibility of the growth process are desired. The molecular beam epitaxy (MBE) system is a technology of choice due to its best short scale (down to atomic scale) control of composition along the growth direction. Recently introduced in situ monitoring of the growth process including feedback to the growth parameters is one possible solution. The pyrometer/reflectometer installed on the growth chamber may be used to monitor and control the growth.

Optical reflectivity measurements may be employed on a wafer level to measure the detuning between the cavities across the grown wafers which are intentionally grown with some variation of detuning. A typical duo-cavity device structure shows a reflectivity spectrum (FIG. 15) which allows for precise determination of the detuning and estimation of Q-factors (losses).

A top view of one embodiment of the device is shown in FIG. 5. Fabrication processing involves dry etching to form via holes for lateral oxidation of the VCSEL aperture, two proton implantations to form modulator aperture and isolation of the devices, respectively, two metal lift-off processes to form Ohmic contacts to top and middle sections of the device, formation of polyimid bridge for the middle contact metallization and final metallization compatible with an RF probing, and backside Ohmic contact formation.

Lateral oxidation technology may be used to fabricate the current/optical aperture of the VCSEL section. Lateral oxidation is known to be sensitive to the Ga content in the AlGaAs oxidation layers and to the properties of the sidewalls of the oxidized mesas. A method for MBE growth of precisely controlled digital alloys (short-period superlattices) may be used for lateral-oxidation layers. In this approach, digital alloys with $AlAs/Al_{0.6}Ga_{0.4}As$ superlattice are used instead of high-Al content AlGaAs ternary alloy layers. The method allowed rules to be established for reproducibility and precise control of the laterally oxidized layers, and fabricate layers with high oxidation rates without compromising mechanical stability of the structure.

High-speed device performance requires reduced device parasitics. One of the parasitic components is a modulator p-i-n junction capacitance. It can be reduced if necessary by increasing the intrinsic region width by a factor of 2-3. Typical to p-i-n diodes, this increase results in a trade-off with time-of-flight parasitics, and both effects should be evaluated together. A thicker diode may also result in modulation depth reduction; as the bias voltage swing required for adequate modulation depth will increase.

Figure 15:
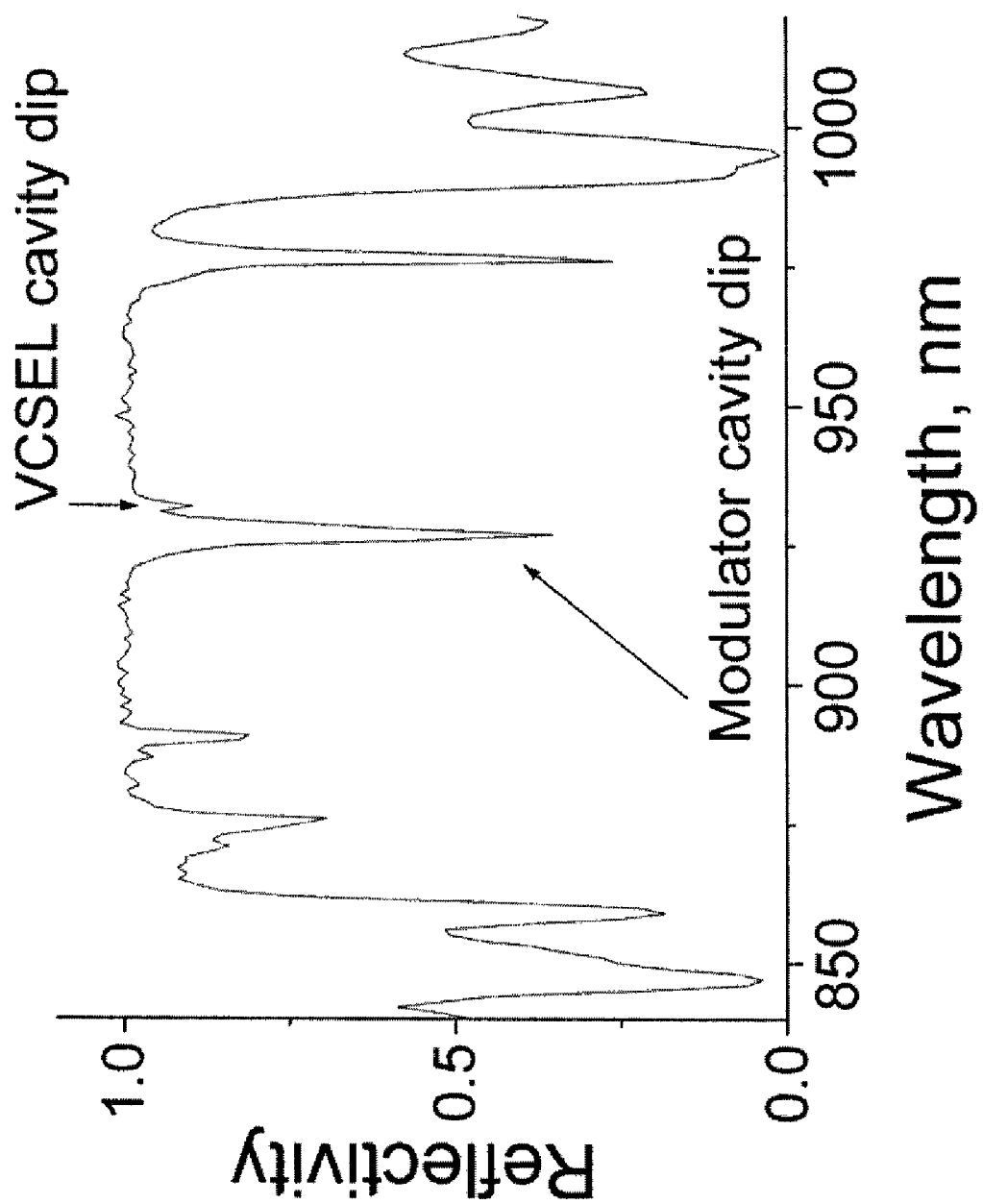
FIG. 15 is a graph of a reflection spectrum for a 7 nm detuned duo-cavity VCSEL-modulator structure, in accordance with an aspect of the present invention.

Dual-cavity VCSEL-modulator emitters have been fabricated and tested to have adequate detuning, coupling and Q-factors of the cavities. As noted, the reflection spectrum from a dual-cavity VCSEL-modulator is shown in FIG. 15. The two dips in the center of the stop-band are identified as follows: the dominant dip corresponds to the modulator low-Q cavity and high-Q VCSEL cavity resonance is visible at the blue shoulder of the modulator cavity.

Figure 16:
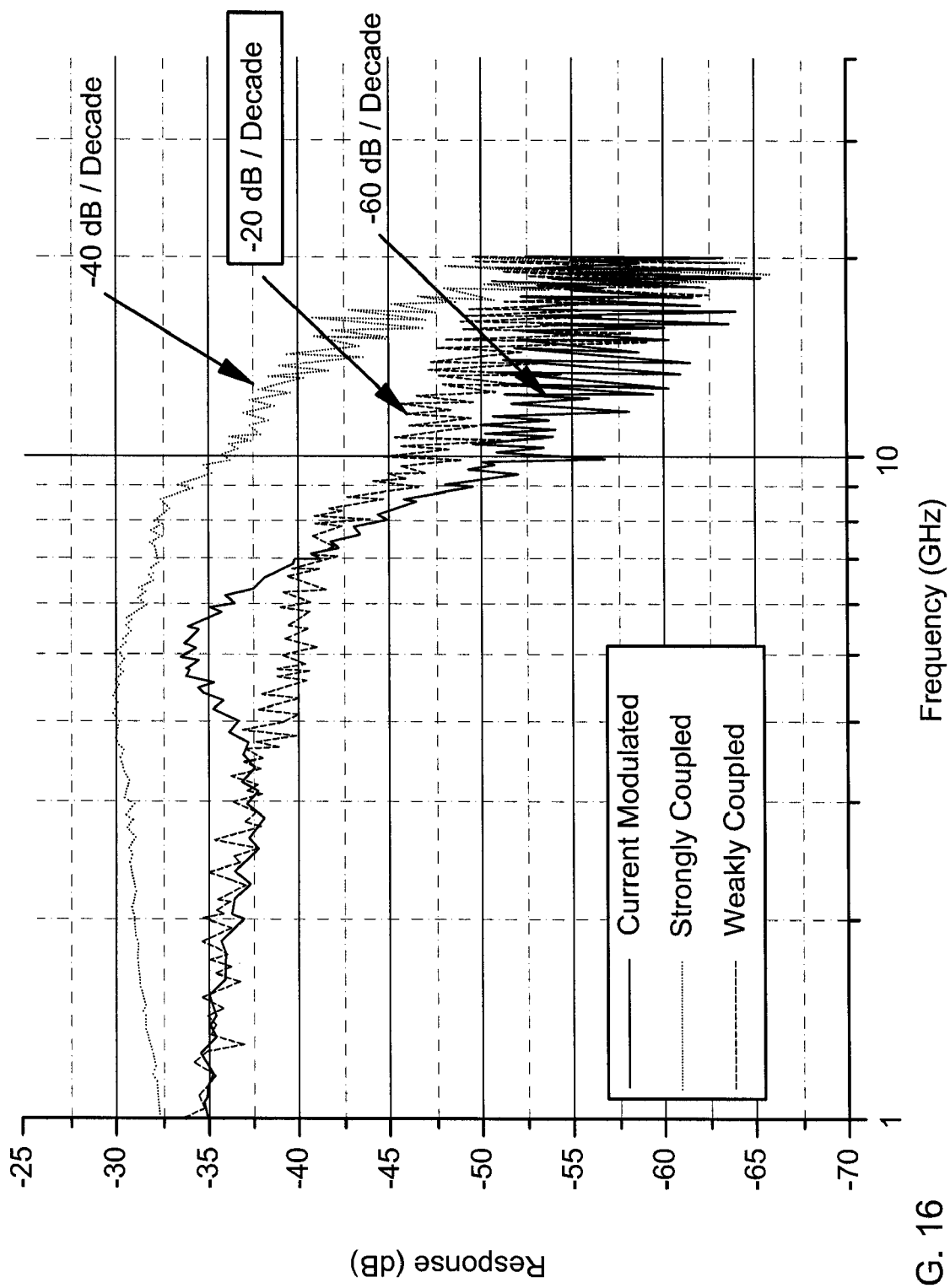
FIG. 16 is a graph illustrating comparison of small-signal high frequency roll-off of a current-modulated VCSEL, a strongly coupled intra-cavity VCSEL-modulator, and a duo-cavity decoupled VCSEL-modulator, in accordance with an aspect of the present invention.

Both intra-cavity VCSEL-modulator and the dual-cavity decoupled VCSEL-modulator disclosed herein have been fabricated, and their modulation performance to each other and with a commercial 10 Gb/s VCSEL is depicted in FIG. 16. All the devices appeared to have quite high RC parasitics of 2-3 GHz. Therefore, their high frequency roll-off's may be determined by internal optoelectronic behavior for loss- and current-modulation devices, respectively, overlapped with a single-pole parasitics. As expected, a −60 dB per decade roll-off was observed for current-modulated VCSELs, and −40 dB per decade for the intra-cavity loss-modulated VCSEL. The decoupled VCSEL-modulator emitter has shown −20 dB per decade slope, determined by parasitics only. More particularly, the different roll-off slopes are characteristic of the modulation method. A −60 dB per decade roll-off for the current-modulated VCSEL corresponds to $1/f^2$ roll-off characteristics of the gain section, with $1/f$ parasitics (where f is the modulation frequency). The −40 dB per decade for the intra-cavity (strongly coupled) VCSEL-modulator corresponds to an intrinsic slope $1/f$ of the device, with $1/f$ parasitics. Advantageously, the −20 dB per decade for the weakly coupled VCSEL-modulator (i.e., the ODVM described herein) corresponds entirely to $1/f$ parasitics. Thus, reduction of the parasitics of the modulator diode (e.g., by reducing its area, increasing the depletion width (reducing capacitance) and reducing the drift time and/or recombination time (by introducing defects)) can result in device operation well above 40 GHz, and most probably well above 100 GHz.

Another feature observed on a dual-cavity device operating at or close to the point of constant reflection is negative relaxation resonance feature and disappearance of the resonance feature as shown in FIG. 14. The device in FIG. 14 has been optimized to give lower parasitics, and as a result has almost flat response up to 20 GHz. It should be noted that the flat response was observed within a very limited range of modulator voltages of ~0.1 V, proving unambiguously that a resonant feature is being employed in these experiments.

To summarize, those skilled in the art will note from the above description that provided herein are a novel device and method for laser-modulator decoupling wherein modulator design is employed to achieve a substantially constant reflectivity from the modulator cavity to the laser cavity as the absorber region modulates a signal on the optical carrier wave. By maintaining reflectivity constant, the conventional need for an optical isolator is advantageously eliminated. Features of the technique include: provision of a modulator in a cavity which is detuned from the associated laser cavity, and the existence of a detuning parameter which decouples the modulator from the cavity at a laser wavelength; provision of a modulator in a cavity which modulates transmission while maintaining reflection constant; enhancement of modulation contrast through adjusting of the Q-factor of a modulator cavity; the ability to provide waveguide DBR or DFB lasers with DBR or Fabry-Perot modulator cavity; an ability to form a VCSEL-modulator hybrid or monolithically integrated device; and a laser section which operates essentially in a continuous wave mode, with modulation response determined entirely by the modulator section.

Advantageously, the technique presented herein provides: extremely high bandwidth devices, limited by the speed of the modulator only, rather than optoelectronic properties of the gain section; allows for miniaturization and integration on the same material platform as the laser and modulator; provides the possibility of an integrated VCSEL-modulator high-bandwidth transmitter with CW operation of the VCSEL and zero feedback from the modulator; provides reduced capacitance of the reverse-biased modulator; provides potentially lower voltage switch for modulation of the cavity; provides a high modulation contrast (similar to that of gain-modulated lasers), which is controlled by the Q-factor of the modulator cavity; allows for a separate optimization of the gain section and modulator section parameter; and provides a reduction in frequency chirping which is essential to reducing dispersion in long fibers in WDM applications.

Advantages of an ODVM device such as proposed herein include: increased bandwidth (>40-100 GH/z) of a VCSEL-modulator, limited by parasitics of the modulator diode only; a reduction of complexity and cost of the module compared with a hybrid integrated laser-modulator; an automatic thermal match between the VCSEL and modulator micro-cavities due to the low thermal impedance of the monolithic semiconductor structure; the growth of VCSEL and modulator structures within a single epitaxial run, thereby increasing accuracy, reproducibility and yield; allowing for the possibility of dual functioning (modulator-photodetector application) of the device and bidirectional optical links.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method, comprising:
    forward-biasing a first resonant cavity including a gain region disposed within a first resonant cavity to generate a carrier wave;
    reverse-biasing a second resonant cavity including an absorber region disposed with the second resonant cavity, the second resonant cavity optically coupled with the first resonant cavity to receive at least a first portion of the carrier wave; and
    modulating a voltage indicative of a signal across the absorber region to modulate absorption of the absorber region, and thereby modulate the signal on the first portion of the carrier wave for transmission, and along with the modulating, controlling reflectivity from the second resonant cavity to the first resonant cavity to minimize change in reflectivity from the second resonant cavity to the first resonant cavity during the modulating.

2. The method of claim 1, wherein the first and second resonant cavities are substantially vertically aligned within a single semiconductor die, and the method further comprises:
emitting a second portion of the optical carrier wave, having the signal modulated thereon, from a surface aperture of the semiconductor die.

3. The method of claim 2, further comprising optically confining a lateral dimension of the optical carrier wave with a confinement aperture defined within an oxide layer disposed within the first resonant cavity.

4. The method of claim 3, further comprising driving the gain region with a direct current ("DC") drive current confined the flowing through the confinement aperture of the oxide layer to concentrate injection current of the gain region above the confinement aperture.

5. The method of claim 2, wherein modulating the voltage indicative of the signal across the absorber region to modulate the signal on the first portion of the optical carrier wave comprises modulating absorption properties of a quantum well structure within the absorber region with the voltage indicative of the signal.

6. The method of claim 1, wherein the controlling comprises detuning the first resonant cavity and the second resonant cavity to minimize change in reflectivity from the second resonant cavity to the first resonant cavity while modulating the signal on the first portion of the carrier wave.

7. The method of claim 6, wherein detuning the first resonant cavity and the second resonant cavity comprises providing a first resonant cavity and the second resonant cavity with resonant wavelengths detuned in the range of 1 nm-30 nm.

8. The method of claim 1, wherein the controlling reflectivity comprises minimizing change in reflectivity from the second resonant cavity to the first resonant cavity by suppressing an AC portion of an optical wave reflected from the second resonant cavity to the first resonant cavity while modulating the signal on the first portion of the carrier wave.

9. The method of claim 1, wherein the first resonant cavity comprises a tunnel $p^+$-$n^+$ junction on an n-type substrate, and wherein optical losses in the first resonant cavity are reduced due to the $p^+$-$n^+$ junction, and wherein series resistivity of the first and second resonant cavities is reduced via an n-type middle reflector serving as a common ground for the first resonant cavity and the second resonant cavity.

10. The method of claim 1, wherein the modulating minimizes change in amplitude of reflection from the second resonant cavity to the first resonant cavity, and wherein the modulating further comprises minimizing change in phase of reflectivity from the modulator cavity to the laser cavity, wherein minimizing change in phase of reflectivity comprises compensating for phase modulation by modulating the refractive index of the absorber region of the second resonant cavity.

11. The method of claim 1, wherein the first resonant cavity and second resonant cavity comprise a modulation transfer function that is independent of frequency and a modulation roll-off that is determined by 1/f parasitics only, wherein f is the modulation frequency.

* * * * *